United States Patent
Pisigan et al.

(10) Patent No.: US 7,915,716 B2
(45) Date of Patent: Mar. 29, 2011

(54) INTEGRATED CIRCUIT PACKAGE SYSTEM WITH LEADFRAME ARRAY

(75) Inventors: Jairus Legaspi Pisigan, Singapore (SG); Jeffrey D. Punzalan, Singapore (SG); Lionel Chien Hui Tay, Singapore (SG); Zigmund Ramirez Camacho, Singapore (SG)

(73) Assignee: Stats Chippac Ltd., Singapore (SG)

( * ) Notice: Subject to any disclaimer, the term of this patent is extended or adjusted under 35 U.S.C. 154(b) by 576 days.

(21) Appl. No.: 11/862,406

(22) Filed: Sep. 27, 2007

(65) Prior Publication Data

US 2009/0085177 A1    Apr. 2, 2009

(51) Int. Cl.
*H01L 23/495* (2006.01)

(52) U.S. Cl. ........ 257/666; 257/676; 257/E23.031

(58) Field of Classification Search ........... 257/666, 257/676, E23.031
See application file for complete search history.

(56) References Cited

U.S. PATENT DOCUMENTS

| | | | |
|---|---|---|---|
| 5,340,771 A | 8/1994 | Rostoker | |
| 5,365,409 A | 11/1994 | Kwon et al. | |
| 6,025,650 A * | 2/2000 | Tsuji et al. | 257/786 |
| RE36,894 E | 10/2000 | Greenberg et al. | |
| 6,150,709 A * | 11/2000 | Shin et al. | 257/666 |
| 6,255,740 B1 * | 7/2001 | Tsuji et al. | 257/792 |
| 6,348,726 B1 | 2/2002 | Bayan et al. | |
| 6,498,392 B2 * | 12/2002 | Azuma | 257/676 |
| 6,689,640 B1 | 2/2004 | Mostafazadeh | |
| 6,740,961 B1 * | 5/2004 | Mostafazadeh | 257/676 |
| 6,818,973 B1 | 11/2004 | Foster | |
| 6,836,008 B2 | 12/2004 | Yu et al. | |
| 6,967,125 B2 * | 11/2005 | Fee et al. | 438/112 |
| 6,975,038 B1 | 12/2005 | Mostafazadeh | |
| 7,001,798 B2 * | 2/2006 | Yamaguchi | 438/114 |
| 7,095,096 B1 * | 8/2006 | Mostafazadeh | 257/666 |
| 7,109,572 B2 | 9/2006 | Fee et al. | |
| 7,186,588 B1 | 3/2007 | Bayan et al. | |
| 7,772,681 B2 * | 8/2010 | Joshi et al. | 257/668 |
| 2003/0109214 A1 * | 6/2003 | Yamashiro | 454/165 |
| 2005/0236701 A1 * | 10/2005 | Minamio et al. | 257/676 |
| 2007/0093000 A1 | 4/2007 | Shim et al. | |
| 2009/0115040 A1 | 5/2009 | Camacho et al. | |
| 2009/0236704 A1 | 9/2009 | Camacho et al. | |

* cited by examiner

*Primary Examiner* — Nitin Parekh
(74) *Attorney, Agent, or Firm* — Mikio Ishimaru

(57) ABSTRACT

An integrated circuit package system includes providing an integrated circuit die; attaching the integrated circuit die over a lead grid having lead blocks; and connecting a die interconnect to the integrated circuit die and the lead blocks.

18 Claims, 16 Drawing Sheets

INTEGRATED CIRCUIT PACKAGE SYSTEM WITH LEADFRAME ARRAY

TECHNICAL FIELD

The present invention relates generally to integrated circuit systems, and more particularly to a system for integrated circuit packages with leadframes.

BACKGROUND ART

Consumers' demands for smaller, cheaper, and faster electronic products directly affect packaging of integrated circuits. Integrated circuits have become an integral part of our daily live particularly in many portable electronic products such as cell phones, portable computers, voice recorders, etc. Integrated circuits are also in many larger electronic systems, such as cars, planes, industrial control systems, etc.

Increasing demand across virtually all aspects of modern life is driving improvements in integrated circuit technology. For essentially all applications, there continues to be demand for reducing cost, size, and increasing performance of electronic packages. Generally, an electronic package is defined as the case and interconnection for integrated circuits also referred to as 'semiconductor device', 'chip' or 'die'.

The case and interconnection can form an electronic system that can provide interfacing and integration with a next level electronic system. The electronic package should provide a structure physically supporting the integrated circuit and protecting the integrated circuit from the environment, a means for removing heat generated by the integrated circuits or system, or electrical connections to provide signal and power access to and from the integrated circuit.

The integrated circuit is electrically connected to the electronic package through several technologies such as wire bonds, solder bumps, planar interconnect, tape connections, etc. One of the more mature and well-developed technologies is wire bonding. The maturity and extensive development contributes to typically lower cost including low cost materials and high yield for a large percentage of usable parts.

Wire bonding technology has been one of the most common techniques used to make electrical connections within the package. Wire bonding may employ gold, aluminum, or copper wires. A wire is typically bonded at one end to the integrated circuit and at the other end to a next-level system such as a substrate, a lead frame, a printed circuit board, a ceramic substrate, or a flexible circuit board.

The integrated circuit can include bond pads for the wire bonding connections. As market trends demand more functions in smaller form factors, packaging can require finer bond pad pitches or spacing, smaller bond pads, or bond pads limited to placement on only some edges of the integrated circuits.

The packages typically include a mounting and connection interface such as a leadframe, substrate, or interposer for electrical connections to the integrated circuit and a next level system such as a printed circuit board or another package. One of the most cost effective of the mounting and connection interfaces is the leadframe.

The leadframe is generally formed as a single unit including an integrated circuit mounting surface such as a die attach pad surrounded by connection strips such as lead fingers. The die attach pad is often a rectangle in the center of the leadframe with the lead fingers radiating from the die attach pad to allow connectivity around the outside edge.

Most commonly the integrated circuit is mounted to the die attach pad and connected to the lead fingers with wires. The die attach pad and lead fingers are held in place as a single unit during manufacturing. Prior to completion, the die attach pad and lead fingers are individually severed to provide electrically unique connections.

Forming the lead fingers around the outside edge of the die attach pad significantly limits the number of unique connections to the electronic package including the integrated circuit. As the demand continues to grow smaller, cheaper, and faster electronic products, manufacturers are seeking ways to cost effectively include more connections within a similar or smaller product size.

Thus, a need still remains for an integrated circuit package system to provide improved connectivity, pricing, and dimensions. In view of the increasing demand for improved integrated circuits and particularly more connections in smaller products at lower costs, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system that includes providing an integrated circuit die; attaching the integrated circuit die over a lead grid having lead blocks; and connecting a die interconnect to the integrated circuit die and the lead blocks.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
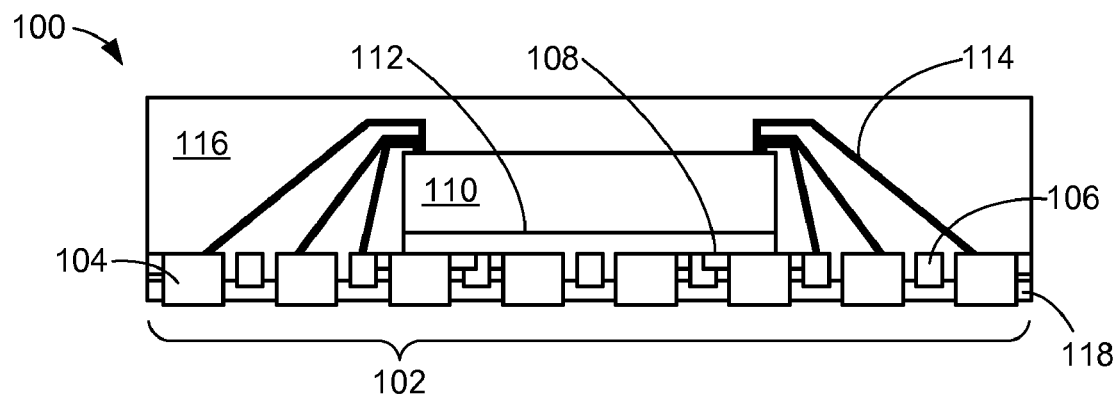
FIG. 1 is a cross-sectional view of an integrated circuit package system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Figure 2:
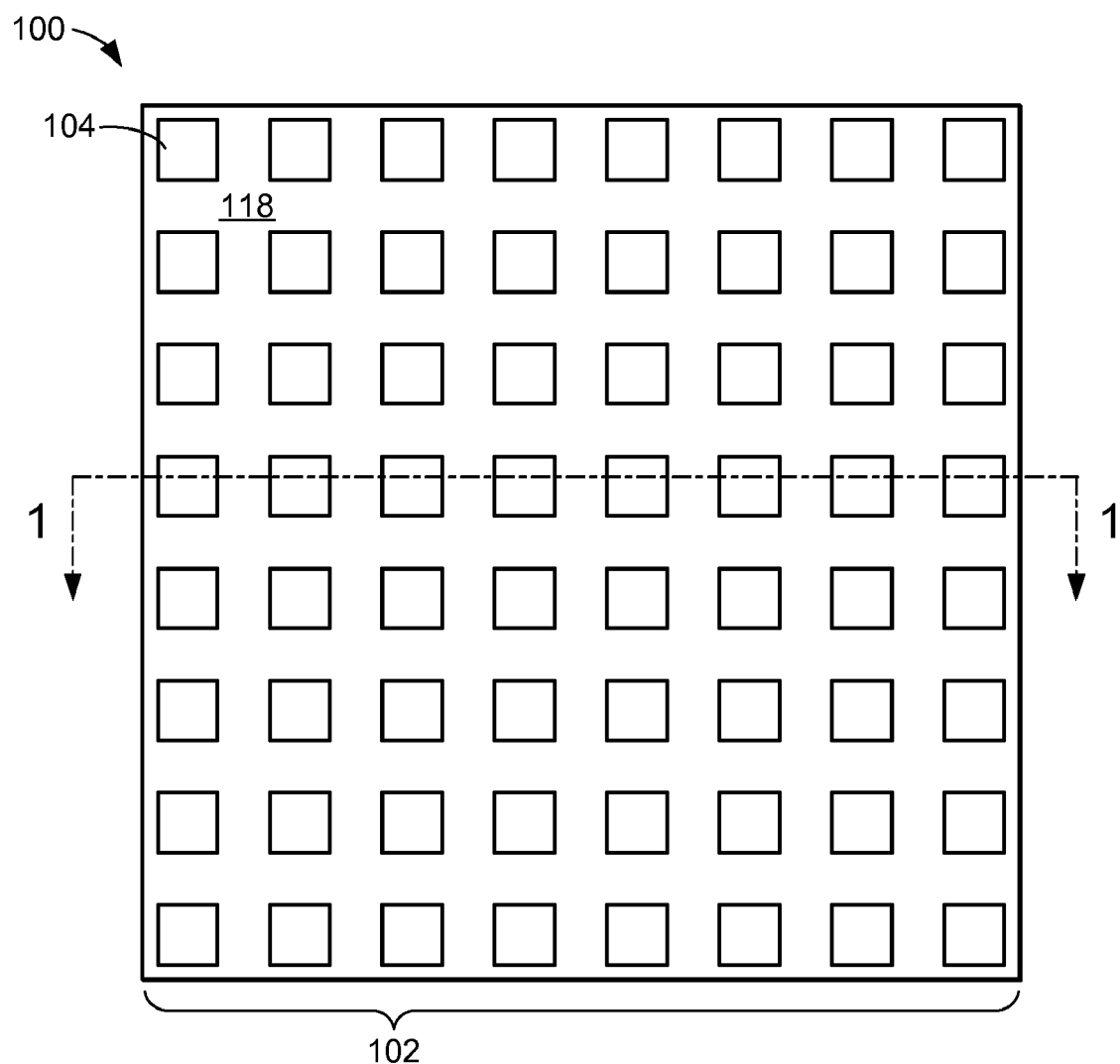
FIG. 2 is a bottom view of the structure of FIG. 1.

Referring now to FIG. 1, therein is shown a cross-sectional view of an integrated circuit package system 100 taken along line 1-1 of FIG. 2 in a first embodiment of the present invention. The integrated circuit package system 100 preferably includes a lead grid 102 having lead blocks 104 and interposers 106. Lead interconnects 108 such as fuse interconnects can electrically connect the lead blocks 104 to the interposers 106 or other of the lead blocks 104.

The lead grid 102 can preferably be formed with a leadframe process such as etching or stamping. Formed as a leadframe, the lead grid 102 can provide compatibility with singulation technology such as sawing or punching. The lead blocks 104 and the interposers 106 formed in a shape of substantially orthogonal rows and columns facilitate electrical isolation with linear isolation processes such as sawing.

For example, the lead blocks 104 can have a thickness substantially the same as a leadframe or leadframe lead. The lead blocks 104 can be in a shape such as a rectangular block, an elliptical block, or other shape substantially the same or different from the interposers 106. The thickness of the lead blocks 104 enable direct contact surfaces for die interconnect and system connection.

An integrated circuit die 110 can be mounted over a portion of the lead grid 102 with a die attach layer 112 such as an adhesive or non-conductive material. The integrated circuit die 110 and the lead blocks 104 of the lead grid 102 can be electrically connected with die interconnects 114 such as a wire bond or other electrical interconnect.

An encapsulant 116 can protect the die interconnects 114, the integrated circuit die 110, and the lead grid 102. The encapsulant 116 can preferably be applied over the die interconnects 114, the integrated circuit die 110, and a portion of the lead grid 102 to cover and protect the die interconnects 114, the integrated circuit die 110, the lead blocks 104, the interposers 106, and connections thereof.

A gap fill material 118 such as a non-conductive material can optionally be applied adjacent the lead blocks 104 of the lead grid 102 over a surface of the encapsulant 116. The gap fill material 118 provides the lead blocks 104 substantially exposed. An exposed surface of the gap fill material 118 can be substantially parallel to an exposed surface of the lead blocks 104 and provide structural integrity, protection, or an attachment surface. The lead blocks 104 extend below the interposers 106. The gap filler material 118 contacts only one side of each of the interposers 106. The die interconnects 114 can connect between the integrated circuit die 110 and the interposers 106.

It has been unexpectedly discovered that the integrated circuit package system 100 having multiple bottom terminal pads such as the lead blocks 104 and "under die pad connection" such as electrical connections under the die attach region, provides improved interconnect routing including eliminating interconnect crossing, connection to any bottom terminal pad, and lower cost due to leadframe technology.

Referring now to FIG. 2, therein is shown a bottom view of the structure of FIG. 1. The integrated circuit package system 100 includes the lead blocks 104 of the lead grid 102 and the gap fill material 118. The gap fill material 118 preferably provides the lead blocks 104 substantially exposed for connection to a next level system such as a printed circuit board or another package.

The lead blocks 104 can provide electrical connectivity to an electrical signal or an electrical level provided to or generated by the integrated circuit die 110 of FIG. 1. The lead blocks 104 can also provide electrical connectivity from one of the lead blocks 104 to another of the lead blocks 104. Any number of the lead blocks 104 may also be electrically isolated from the integrated circuit die 110 or the next level system.

Figure 3:
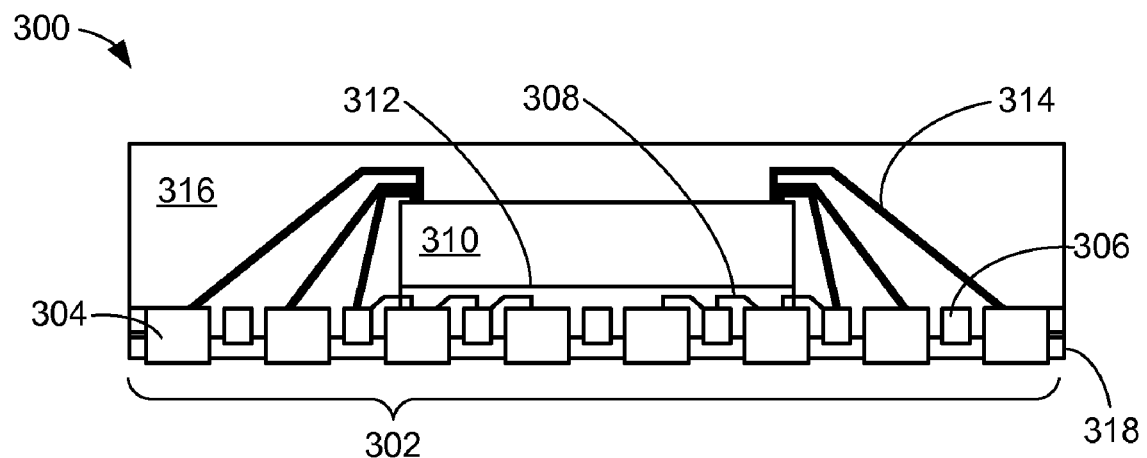
FIG. 3 is a cross-sectional view of an integrated circuit package system in a second embodiment of the present invention.

Referring now to FIG. 3, therein is shown a cross-sectional view of an integrated circuit package system 300 in a second embodiment of the present invention. Similar to the integrated circuit package system 100, the integrated circuit package system 300 preferably includes a lead grid 302 having lead blocks 304 and interposers 306. Lead interconnects 308 such as fuse interconnects can electrically connect the lead blocks 304 to the interposers 306 or other of the lead blocks 304.

The lead grid 302 can preferably be formed with a leadframe process such as etching or stamping. Formed as a leadframe, the lead grid 302 can provide compatibility with singulation technology such as sawing or punching. The lead blocks 304 and the interposers 306 formed in a shape of substantially orthogonal rows and columns facilitate electrical isolation with linear isolation processes such as sawing.

For example, the lead blocks 304 can have a thickness substantially the same as a leadframe or leadframe lead. The lead blocks 304 can be in a shape such as a rectangular block, an elliptical block, or other shape substantially the same or different from the interposers 306. The thickness of the lead blocks 304 enable direct contact surfaces for die interconnect and system connection.

An integrated circuit die 310 can be mounted over a portion of the lead grid 302 with a die attach layer 312 such as an adhesive or non-conductive material. The integrated circuit die 310 and the lead blocks 304 of the lead grid 302 can be electrically connected with die interconnects 314 such as a wire bond or other electrical interconnect.

An encapsulant 316 can protect the die interconnects 314, the integrated circuit die 310, and the lead grid 302. The encapsulant 316 can preferably be applied over the die interconnects 314, the integrated circuit die 310, and a portion of the lead grid 302 to cover and protect the die interconnects 314, the integrated circuit die 310, the lead blocks 304, the interposers 306, and connections thereof.

A gap fill material 318 such as a non-conductive material can optionally be applied adjacent the lead blocks 304 of the lead grid 302 over a surface of the encapsulant 316. The gap fill material 318 provides the lead blocks 304 substantially exposed. An exposed surface of the gap fill material 318 can be substantially parallel to an exposed surface of the lead blocks 304 and provide structural integrity, protection, or an attachment surface.

Figure 4:
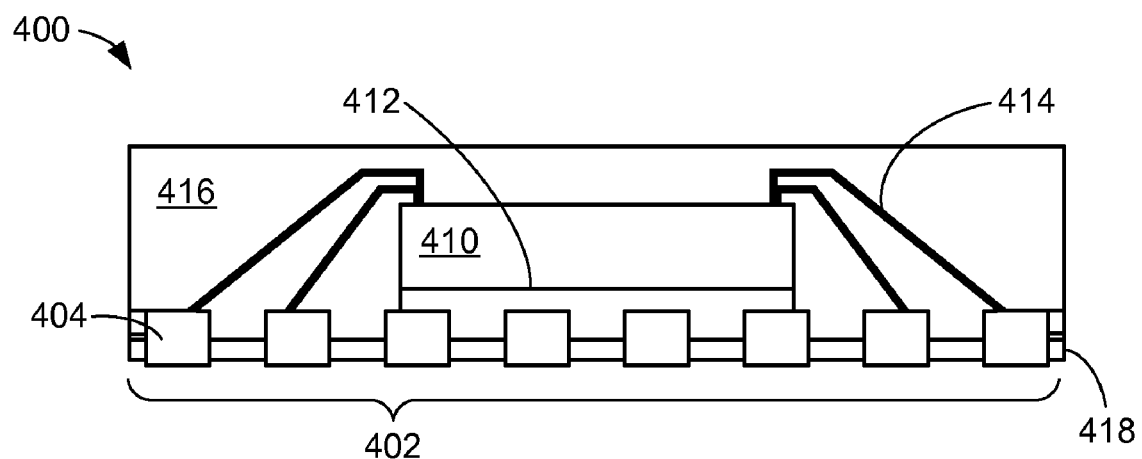
FIG. 4 is a cross-sectional view of an integrated circuit package system in a third embodiment of the present invention.

Referring now to FIG. 4, therein is shown a cross-sectional view of an integrated circuit package system 400 in a third embodiment of the present invention. Similar to the integrated circuit package system 100, the integrated circuit package system 400 preferably includes a lead grid 402 having lead blocks 404.

The lead grid 402 can preferably be formed with a leadframe process such as etching or stamping. Formed as a leadframe, the lead grid 402 can provide compatibility with singulation technology such as sawing or punching. The lead blocks 404 formed in a shape of substantially orthogonal rows and columns facilitate electrical isolation with linear isolation processes such as sawing.

For example, the lead blocks 404 can have a thickness substantially the same as a leadframe or leadframe lead. The lead blocks 404 can be in a shape such as a rectangular block, an elliptical block, or other shape substantially the same or different from another of the lead blocks 404. The thickness of the lead blocks 404 enable direct contact surfaces for die interconnect and system connection.

An integrated circuit die 410 can be mounted over a portion of the lead grid 402 with a die attach layer 412 such as an adhesive or non-conductive material. The integrated circuit die 410 and the lead blocks 404 of the lead grid 402 can be electrically connected with die interconnects 414 such as a wire bond or other electrical interconnect.

An encapsulant 416 can protect the die interconnects 414, the integrated circuit die 410, and the lead grid 402. The encapsulant 416 can preferably be applied over the die interconnects 414, the integrated circuit die 410, and a portion of the lead grid 402 to cover and protect the die interconnects 414, the integrated circuit die 410, the lead blocks 404, and connections thereof.

A gap fill material 418 such as a non-conductive material can optionally be applied adjacent the lead blocks 404 of the lead grid 402 over a surface of the encapsulant 416. The gap fill material 418 provides the lead blocks 404 substantially exposed. An exposed surface of the gap fill material 418 can be substantially parallel to an exposed surface of the lead blocks 404 and provide structural integrity, protection, or an attachment surface.

Figure 5:
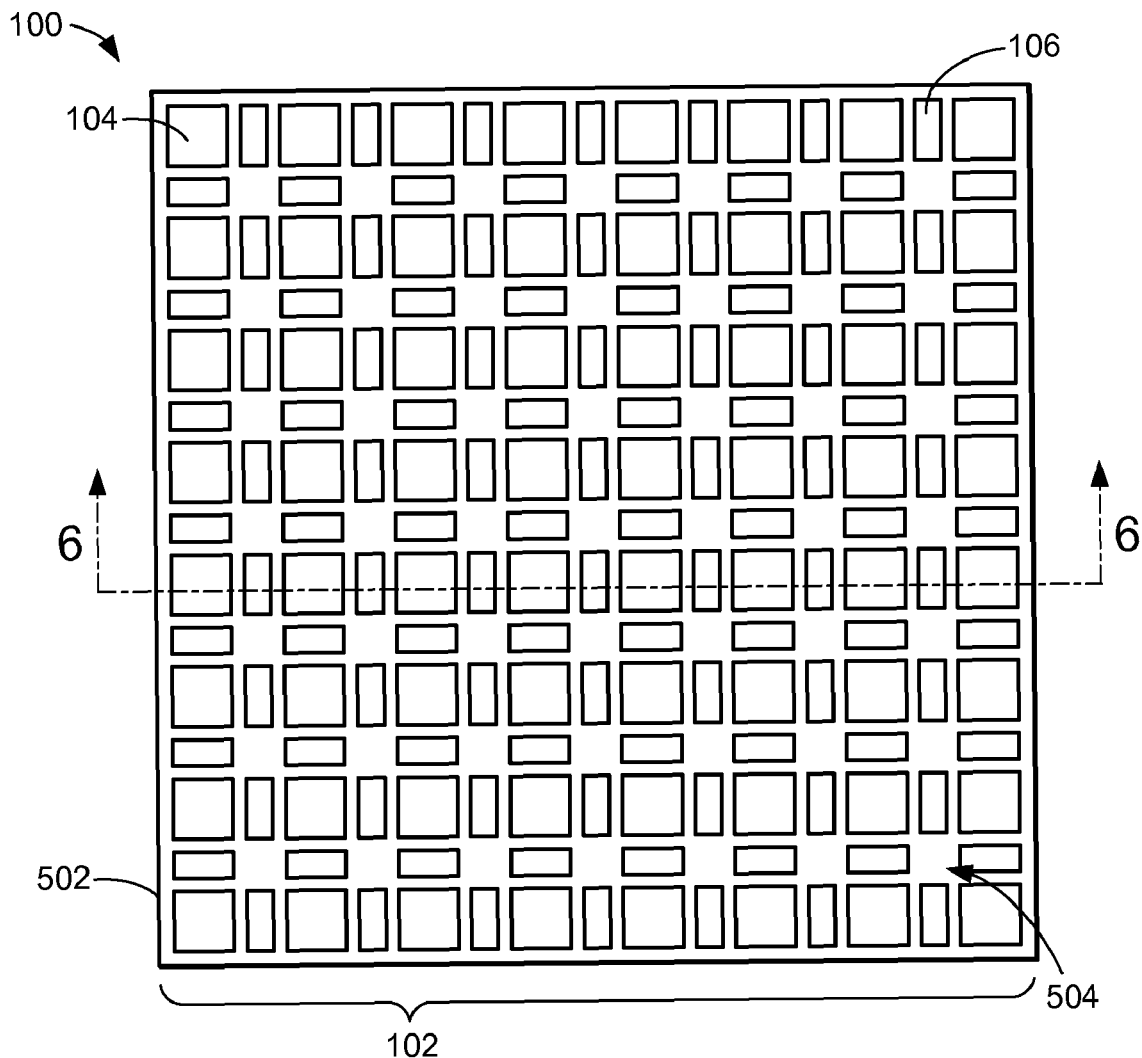
FIG. 5 is a top view of the integrated circuit package system in a leadframe formation phase.

Referring now to FIG. 5, therein is shown a top view of the integrated circuit package system 100 in a leadframe formation phase. The lead grid 102 can be formed as a leadframe substantially the same as the lead grid 302. The lead grid 102 preferably includes the lead blocks 104, the interposers 106, as well as a leadframe body 502. The leadframe body 502 surrounds the lead blocks 104 and the interposers 106 and can optionally provide an outer edge of the lead grid 102.

For example, the lead grid 102 formed with a leadframe process can include all of the lead blocks 104, the interposers 106, and the leadframe body 502 connected. The lead blocks 104, the interposers 106, and the leadframe body 502 can be formed of a same material and a same process and compatible with singulation or isolation processes. The lead grid 102 formed as a leadframe provides the lead blocks 104 and the interposers 106 substantially fixed during processing.

The lead grid 102 can include the lead blocks 104 and the interposers 106 preferably formed by a material removal process such as a half-etch applied to a top surface of the leadframe body 502. Removal of material from the leadframe body 502 provides a top surface of the lead blocks 104 and a top surface of the interposers 106 substantially exposed and in a separate plane from a leadframe top recess 504 of the top surface of the leadframe body 502.

For example, each of the lead blocks 104 is substantially the shape of a square. The lead blocks 104 are in substantially orthogonal rows and columns. The interposers 106 are substantially the shape of a rectangle having a length substantially equal to a side of the lead blocks 104. The interposers 106 having a shorter width are formed in spaces between the lead blocks 104 with the length of the interposers 106 substantially parallel to adjacent sides of the lead blocks 104.

Figure 6:
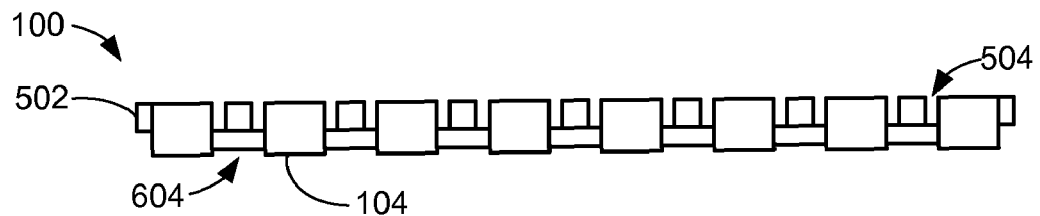
FIG. 6 is a cross-sectional view of the structure of FIG. 5 taken along line 6-6 of FIG. 5.

Referring now to FIG. 6, therein is shown a cross-sectional view of the structure of FIG. 5 taken along line 6-6 of FIG. 5. The integrated circuit package system 100 preferably includes the lead blocks 104, the interposers 106, and the leadframe body 502. The lead blocks 104, the interposers 106, and the leadframe body 502 can be formed as a leadframe and each can be formed of the same or different materials.

A leadframe bottom recess 604 similar to the leadframe top recess 504 can preferably be formed by a material removal process such as a half-etch applied to a bottom surface of the leadframe body 502. The leadframe bottom recess 604 can be formed in the leadframe body 502 adjacent the lead blocks 104 providing a bottom surface of the lead blocks 104 substantially exposed and in a separate plane from the leadframe bottom recess 604.

Figure 7:
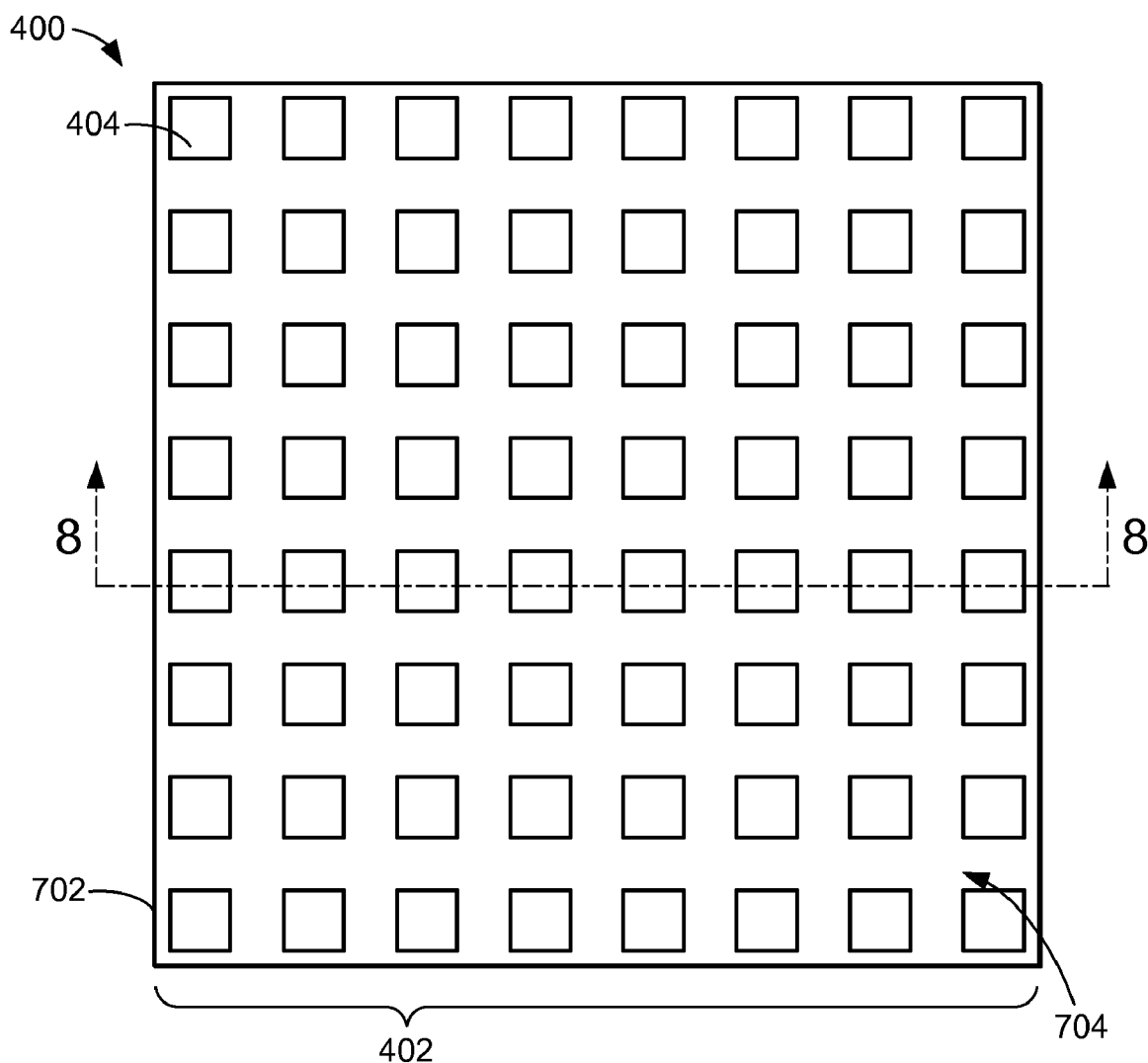
FIG. 7 is a top view of the integrated circuit package system in a leadframe formation phase.

Referring now to FIG. 7, therein is shown a top view of the integrated circuit package system 400 in a leadframe formation phase. The lead grid 402 can be formed as a leadframe substantially the same as the lead grid 302. The lead grid 402 preferably includes the lead blocks 404 as well as a leadframe body 702. The leadframe body 702 surrounds the lead blocks 404 and can optionally provide an outer edge of the lead grid 402.

For example, the lead grid 402 formed with a leadframe process can include all of the lead blocks 404 and the leadframe body 702 connected. The lead blocks 404 and the leadframe body 702 can be formed of a same material and a same process and compatible with singulation or isolation processes. The lead grid 402 formed as a leadframe provides the lead blocks 404 substantially fixed during processing.

The lead grid 402 can include the lead blocks 404 preferably formed by a material removal process such as a half-etch applied to a top surface of the leadframe body 702. Removal of material from the leadframe body 702 provides a top surface of the lead blocks 404 substantially exposed and in a separate plane from a leadframe top recess 704 of the top surface of the leadframe body 702.

For example, each of the lead blocks 404 is substantially the shape of a square. The lead blocks 404 are in substantially orthogonal rows and columns. Sides of the lead blocks 404 are substantially parallel to sides of another of the lead blocks 404. The lead grid 402 is also substantially the shape of a square formed by the lead blocks 404.

Figure 8:
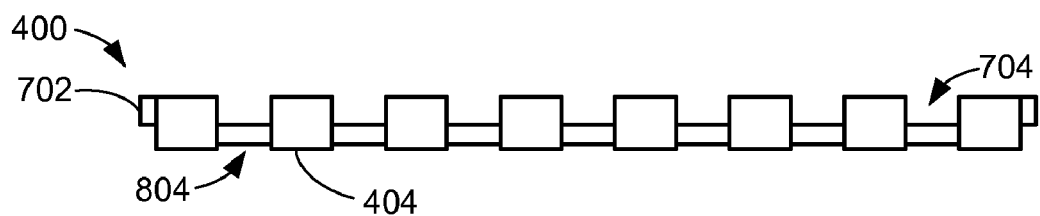
FIG. 8 is a cross-sectional view of the structure of FIG. 7 taken along line 8-8 of FIG. 7.

Referring now to FIG. 8, therein is shown a cross-sectional view of the structure of FIG. 7 taken along line 8-8 of FIG. 7. The integrated circuit package system 400 preferably includes the lead blocks 404 and the leadframe body 702. The lead blocks 404 and the leadframe body 702 can be formed as a leadframe and each can be formed of the same or different materials.

A leadframe bottom recess 804 similar to the leadframe top recess 704 can preferably be formed by a material removal process such as a half-etch applied to a bottom surface of the leadframe body 702. The leadframe bottom recess 804 can be formed in the leadframe body 702 adjacent the lead blocks 404 providing a bottom surface of the lead blocks 404 substantially exposed and in a separate plane from the leadframe bottom recess 804.

Figure 9:
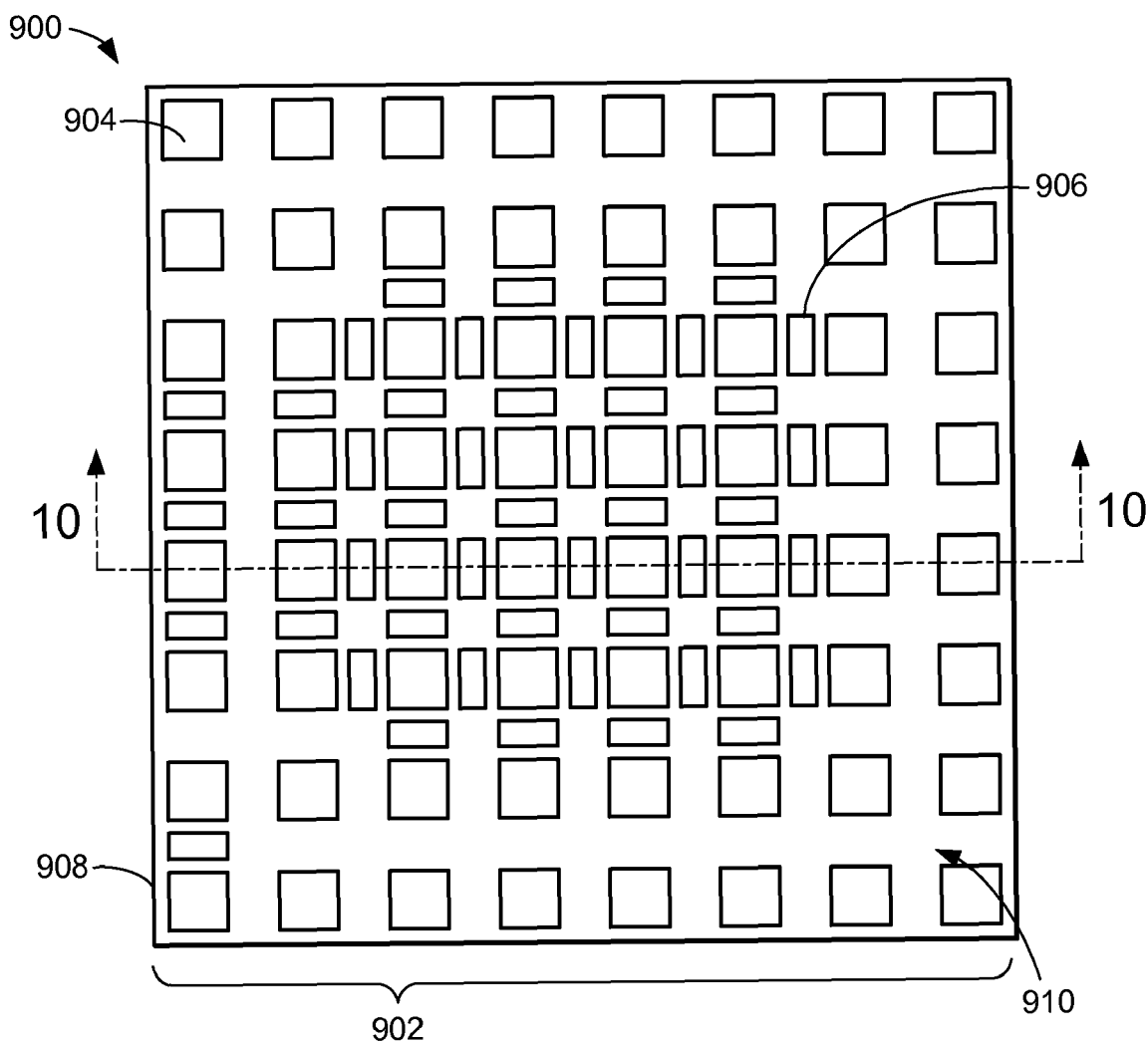
FIG. 9 is a top view of the integrated circuit package system in a leadframe formation phase of a fourth embodiment of the present invention.

Referring now to FIG. 9, therein is shown a top view of an integrated circuit package system 900 in a leadframe formation phase of a fourth embodiment of the present invention. Similar to the lead grid 102 as shown in FIG. 5, a lead grid 902 can be formed as a leadframe. The lead grid 902 preferably includes lead blocks 904, interposers 906, as well as a leadframe body 908. The leadframe body 908 surrounds the lead blocks 904 and the interposers 906 and can optionally provide an outer edge of the lead grid 902.

For example, the lead grid 902 formed with a leadframe process can include all of the lead blocks 904, the interposers 906, and the leadframe body 908 connected. The lead blocks 904, the interposers 906, and the leadframe body 908 can be formed of a same material and a same process and compatible with singulation or isolation processes. The lead grid 902 formed as a leadframe provides the lead blocks 904 and the interposers 906 substantially fixed during processing.

The lead grid 902 can include the lead blocks 904 and the interposers 906 preferably formed by a material removal process such as a half-etch applied to a top surface of the leadframe body 908. Removal of material from the leadframe body 908 provides a top surface of the lead blocks 904 and a top surface of the interposers 906 substantially exposed and in a separate plane from a leadframe top recess 910 of the top surface of the leadframe body 908.

For example, each of the lead blocks 904 is substantially the shape of a square. The lead blocks 904 are in substantially orthogonal rows and columns. The interposers 906 are substantially the shape of a rectangle having a length substantially equal to a side of the lead blocks 904. The interposers 906 having a shorter width are formed in a portion of spaces between the lead blocks 904 in substantially the center of the lead grid 902. The length of the interposers 906 is substantially parallel to adjacent sides of the lead blocks 904.

Figure 10:
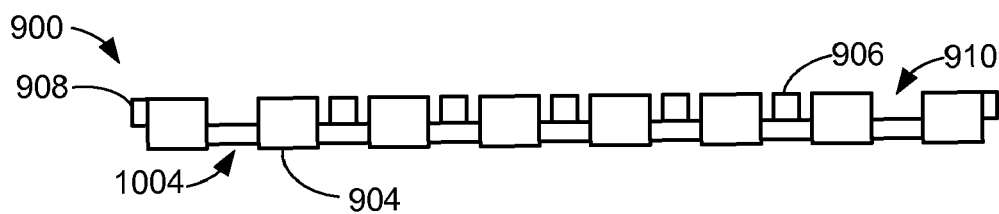
FIG. 10 is a cross-sectional view of the structure of FIG. 9 taken along line 10-10 of FIG. 9.

Referring now to FIG. 10, therein is shown a cross-sectional view of the structure of FIG. 9 taken along line 10-10 of FIG. 9. The integrated circuit package system 900 preferably includes the lead blocks 904, the interposers 906, and the leadframe body 908. The lead blocks 904, the interposers 906, and the leadframe body 908 can be formed as a leadframe and each can be formed of the same or different materials.

A leadframe bottom recess 1004 similar to the leadframe top recess 910 can preferably be formed by a material removal process such as a half-etch applied to a bottom surface of the leadframe body 908. The leadframe bottom recess 1004 can be formed in the leadframe body 908 adjacent the lead blocks 904 providing a bottom surface of the lead blocks 904 substantially exposed and in a separate plane from the leadframe bottom recess 1004.

Figure 11:
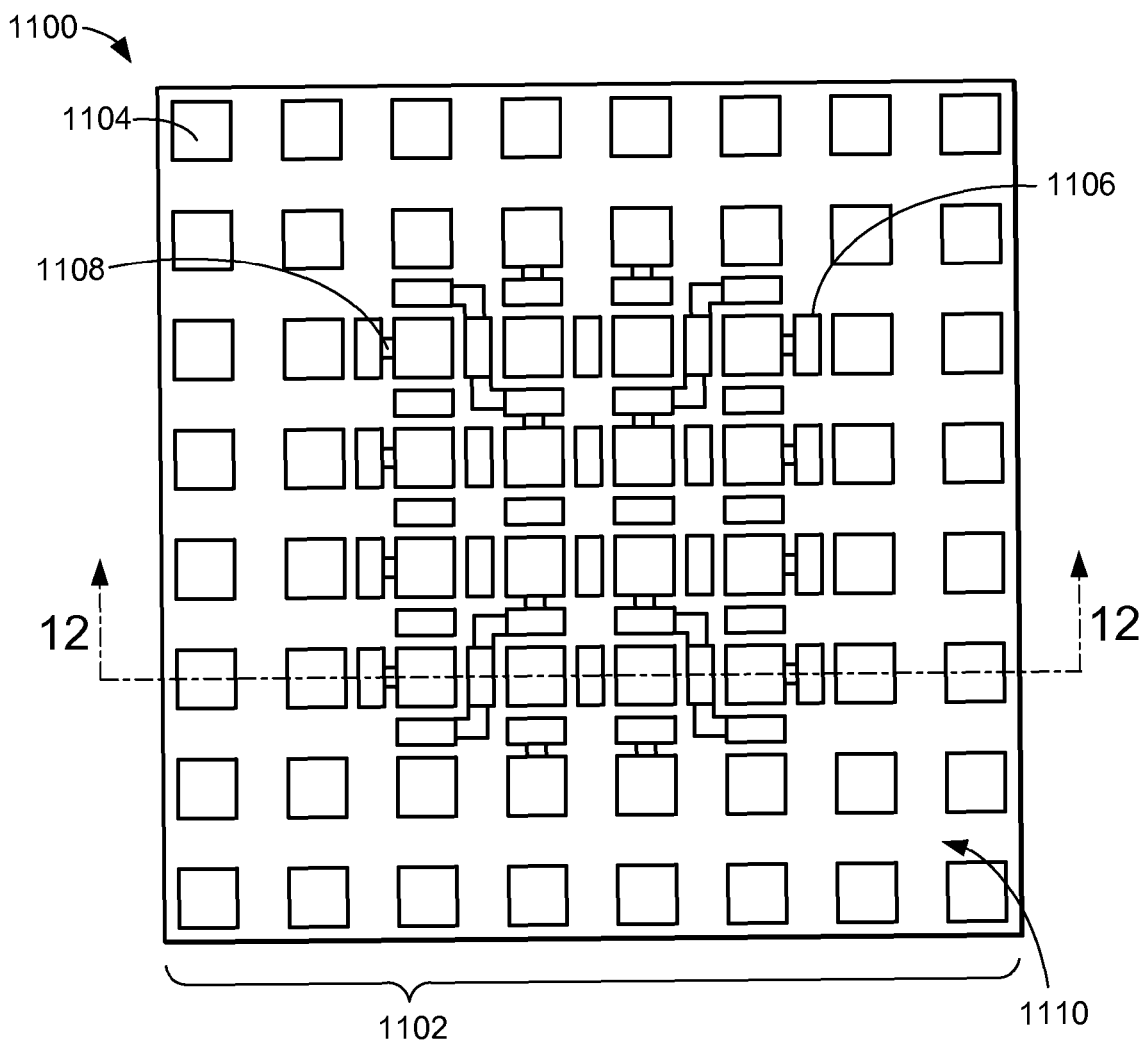
FIG. 11 is a top view of an integrated circuit package system in a lead fuse phase of a fifth embodiment of the present invention.

Referring now to FIG. 11, therein is shown a top view of an integrated circuit package system 1100 in a lead fuse phase of a fifth embodiment of the present invention. Similar to the integrated circuit package system 100, the integrated circuit package system 1100 preferably includes a lead grid 1102 having lead blocks 1104 and interposers 1106. Lead interconnects 1108 such as fuse interconnects can electrically connect the lead blocks 1104 to the interposers 1106 or other of the lead blocks 1104.

The lead grid 1102 can preferably be formed with leadframe technology such as etching or stamping. Formed as a leadframe, the lead grid 1102 can provide compatibility with singulation technology such as sawing or punching. The lead blocks 1104 and the interposers 1106 formed in a shape of substantially orthogonal rows and columns facilitate electrical isolation with linear isolation processes such as sawing.

For example, the lead blocks 1104 can have a thickness substantially the same as a leadframe or leadframe lead. The lead blocks 1104 can be in a shape such as a rectangular block, an elliptical block, or other shape substantially the same or different from the interposers 1106. The thickness of the lead blocks 1104 enable direct contact surfaces for die interconnect and system connection.

The lead grid 1102 can include the lead blocks 1104 and the interposers 1106 preferably formed by a material removal process such as a half-etch applied to a top surface of the lead grid 1102. Removal of material from the lead grid 1102 provides a top surface of the lead blocks 1104 and a top surface of the interposers 1106 substantially exposed and in a separate plane from a leadframe top recess 1110 of the top surface of the lead grid 1102.

The lead interconnects 1108 provide connectivity to the lead blocks 1104 and the interposers 1106 particularly near a predetermined region. The predetermined region can be based on the lead interconnects 1108 or the interposers 1106 covered during further processing whereby the lead interconnects 1108 can provide connectivity to the lead interconnects 1108 or the interposers 1106 substantially exposed during further processing.

The lead blocks 1104 and the interposers 1106 provide connectivity for the integrated circuit package system 1100 and to a next level system such as a printed circuit board or another package. The lead interconnects 1108 can provide connectivity between the lead blocks 1104 and the interposers 1106 particularly in regions covered by further processing thereby providing improved routing.

Figure 12:
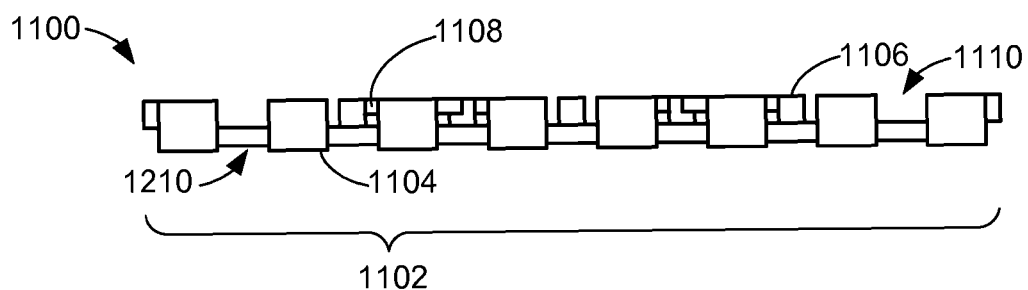
FIG. 12 is a cross-sectional view taken along line 12-12 of FIG. 11.

Referring now to FIG. 12, therein is shown a cross-sectional view taken along line 12-12 of FIG. 11. The integrated circuit package system 1100 preferably includes the lead blocks 1104 and the interposers 1106 of the lead grid 1102. The lead blocks 1104, the interposers 1106, or the lead grid 1102 can be formed as a leadframe and each can be formed of the same or different materials.

A leadframe bottom recess 1210 similar to the leadframe top recess 1110 can preferably be formed by a material removal process such as a half-etch applied to a bottom surface of the lead grid 1102. The leadframe bottom recess 1210 can be formed in the lead grid 1102 adjacent the lead blocks 1104 providing a bottom surface of the lead blocks 1104 substantially exposed and in a separate plane from the leadframe bottom recess 1210.

Figure 13:
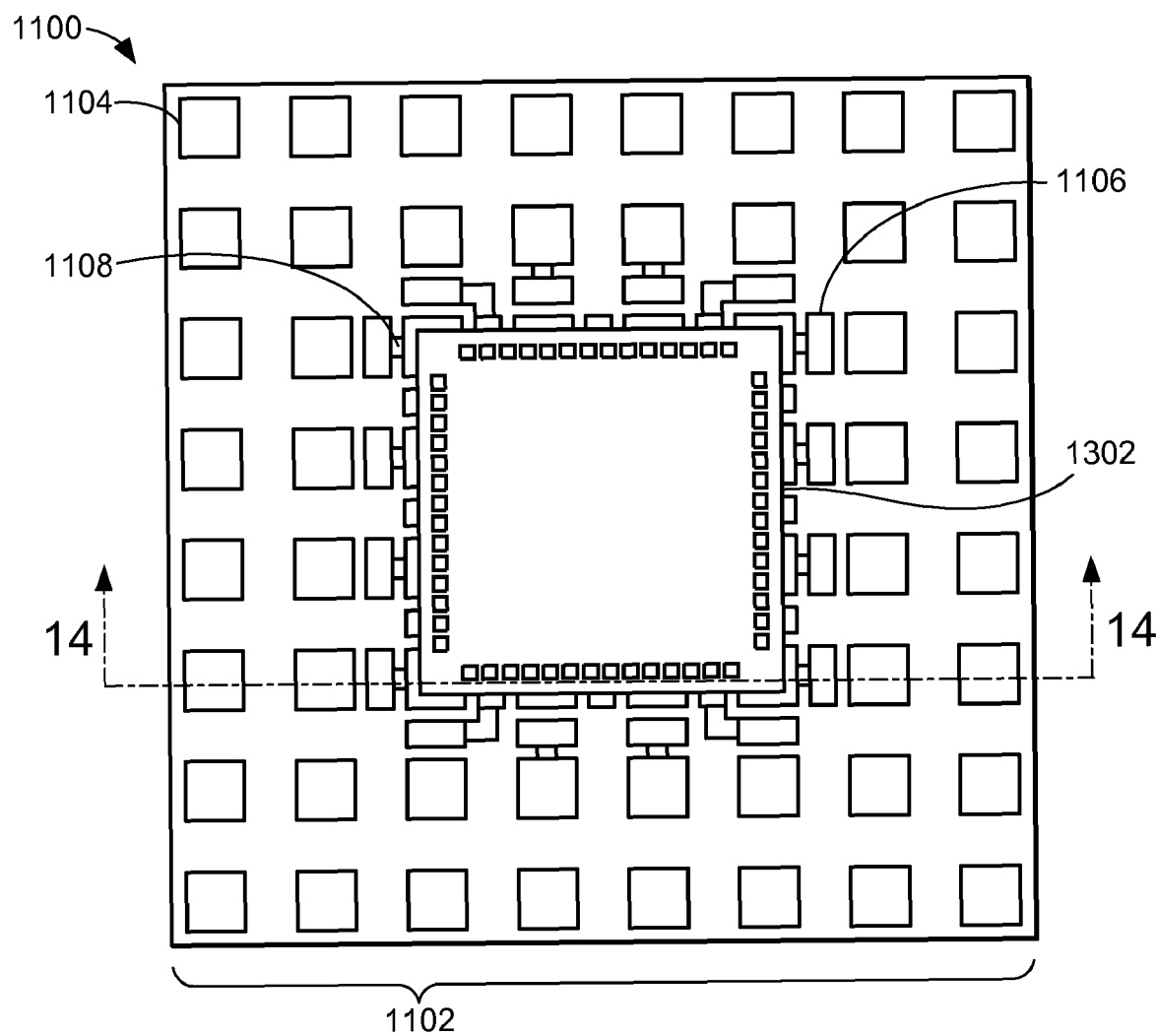
FIG. 13 is a top view of the structure of FIG. 12 in a die attachment phase.

Referring now to FIG. 13, therein is shown a top view of the structure of FIG. 12 in a die attachment phase. The integrated circuit package system 1100 preferably includes the lead blocks 1104 and the interposers 1106 of the lead grid 1102 as well as the lead interconnects 1108. An integrated circuit die 1302 can be mounted over a portion of the lead grid 1102.

The lead blocks 1104 and the interposers 1106 provide connectivity for the integrated circuit die 1302 to the lead grid 1102 or the next level system. The lead interconnects 1108 can provide connectivity between the lead blocks 1104 and the interposers 1106 particularly in regions covered by the integrated circuit die 1302 thereby improving routing of the integrated circuit package system 1100.

Figure 14:
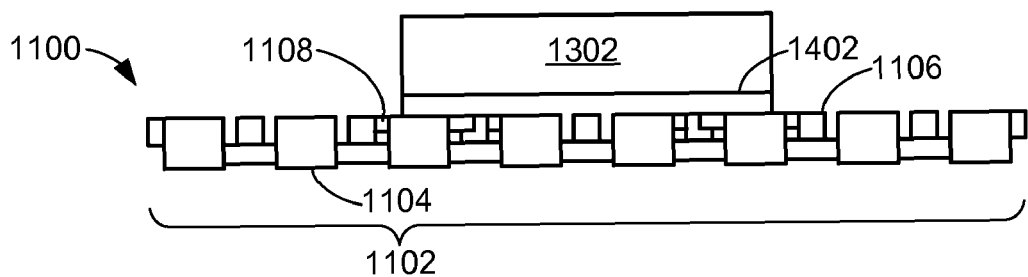
FIG. 14 is a cross-sectional view taken along line 14-14 of FIG. 13.

Referring now to FIG. 14, therein is shown a cross-sectional view taken along line 14-14 of FIG. 13. The integrated circuit package system 1100 preferably includes the lead blocks 1104 and the interposers 1106 of the lead grid 1102 as well as the lead interconnects 1108. The lead interconnects 1108 can provide connectivity between the lead blocks 1104 and the interposers 1106 particularly in a region covered by the integrated circuit die 1302.

The integrated circuit die 1302 can be mounted over a portion of the lead grid 1102 with a die attach layer 1402 such as an adhesive or non-conductive material. The die attach layer 1402 can provide adhesion or isolation of the integrated circuit die 1302 and the lead grid 1102. The lead interconnects 1108 can provide connectivity to the lead blocks 1104 and the interposers 1106 covered by the integrated circuit die 1302 thereby improving routing of the lead grid 1102.

Figure 15:
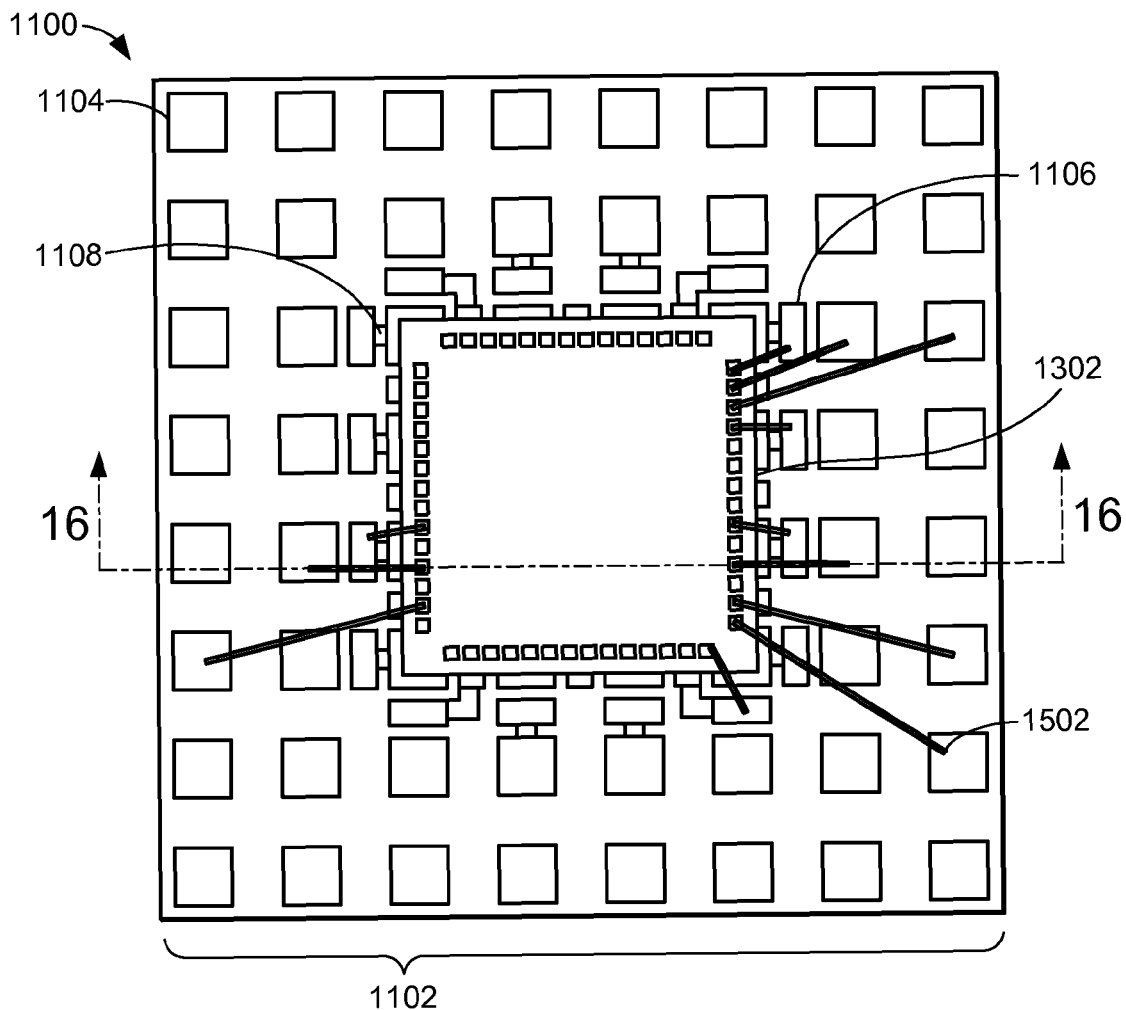
FIG. 15 is a top view of the structure of FIG. 14 in a die connection phase.

Referring now to FIG. 15, therein is shown a top view of the structure of FIG. 14 in a die connection phase. The integrated circuit package system 1100 preferably includes the integrated circuit die 1302, the lead interconnects 1108, and the lead grid 1102 including the lead blocks 1104 and the interposers 1106. Die interconnects 1502 such as a wire bond or other electrical interconnect can be attached to the integrated circuit die 1302, the lead blocks 1104, or the interposers 1106.

The integrated circuit die 1302 can be electrically connected to and-the lead blocks 1104 or the interposers 1106 of the lead grid 1102 with the die interconnects 1502. The die interconnects 1502 can provide connectivity for logic signals or electrical levels to the integrated circuit die 1302, the lead blocks 1104, or the interposers 1106 thereby providing connectivity to the integrated circuit package system 1100 or the next level system.

Figure 16:
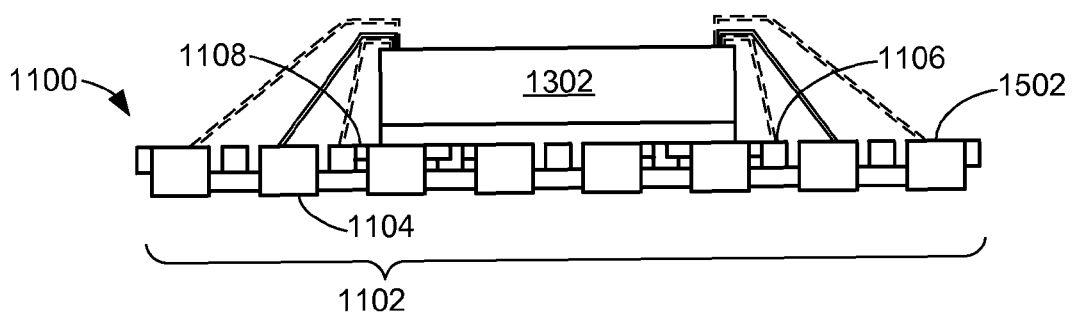
FIG. 16 is a cross-sectional view taken along line 16-16 of FIG. 15.

Referring now to FIG. 16, therein is shown a cross-sectional view taken along line 16-16 of FIG. 15. The integrated circuit package system 1100 preferably includes the integrated circuit die 1302, the lead interconnects 1108, and the lead grid 1102 including the lead blocks 1104 and the interposers 1106. The die interconnects 1502 can be attached to the integrated circuit die 1302, the lead blocks 1104, or the interposers 1106.

The die interconnects 1502 can provide connectivity to the lead blocks 1104 and the interposers 1106. The die interconnects 1502 with the lead interconnects 1108 can also provide connectivity to the lead blocks 1104 and the interposers 1106 covered by the integrated circuit die 1302. The lead blocks 1104 can provide connectivity to the die interconnects 1502 thereby providing connectivity to the next level system.

Figure 17:
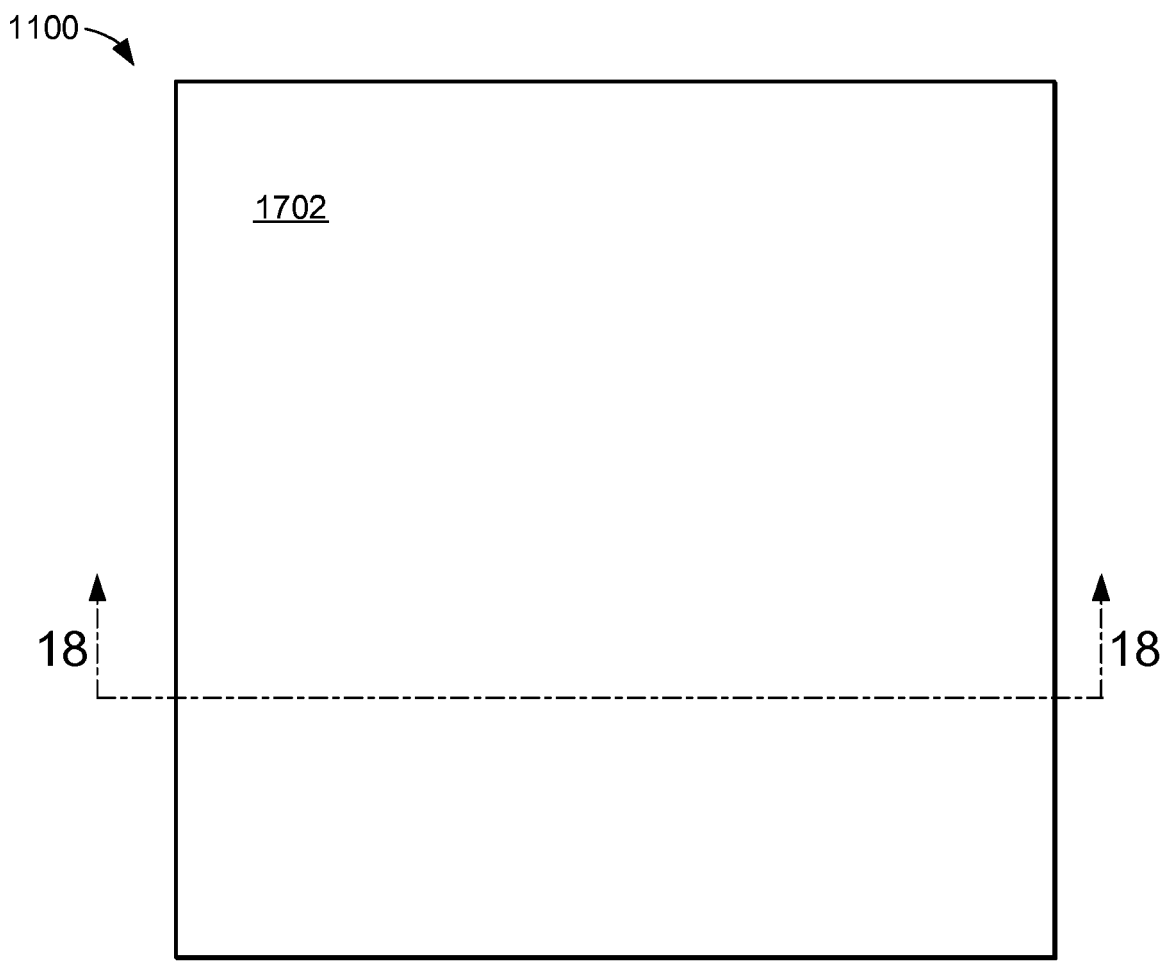
FIG. 17 is a top view of the structure of FIG. 16 in an encapsulation phase.

Referring now to FIG. 17, therein is shown a top view of the structure of FIG. 16 in an encapsulation phase. The integrated circuit package system 1100 preferably includes the die interconnects 1502 of FIG. 15, the integrated circuit die 1302 of FIG. 13, the lead interconnects 1108 of FIG. 11, and the lead grid 1102 of FIG. 11 including the lead blocks 1104 of FIG. 11, the interposers 1106 of FIG. 11.

An encapsulant 1702 such as an epoxy or mold compound can protect the die interconnects 1502, the integrated circuit die 1302, and the lead grid 1102. The encapsulant 1702 can preferably be applied over the die interconnects 1502, the integrated circuit die 1302, and a portion of the lead grid 1102 to cover and protect the die interconnects 1502, the integrated circuit die 1302, the lead blocks 1104, the interposers 1106, and connections thereof.

Figure 18:
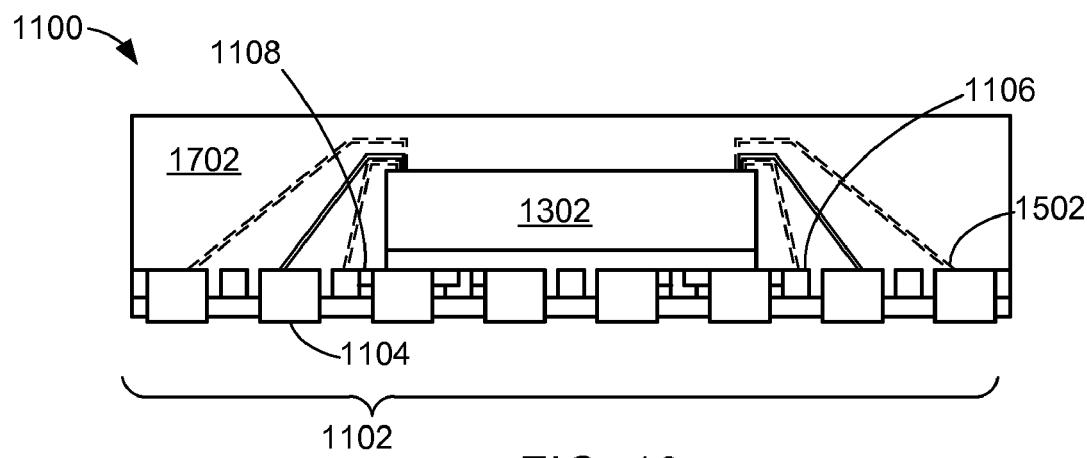
FIG. 18 is a cross-sectional view taken along line 18-18 of FIG. 17.

Referring now to FIG. 18, therein is shown a cross-sectional view taken along line 18-18 of FIG. 17. The integrated circuit package system 1100 preferably includes the die interconnects 1502, the integrated circuit die 1302, the lead interconnects 1108, and the lead grid 1102 including the lead blocks 1104, the interposers 1106.

The encapsulant 1702 can be applied with an encapsulation process such as transfer molding, glob top, or tape lid to cover and protect the die interconnects 1502, the integrated circuit die 1302, the lead interconnects 1108, and a portion of the lead grid 1102. The encapsulant 1702 can optionally be conformal, a lid, or a cover and can optionally provide a hermetic seal, structural integrity, or protective cover.

Figure 19:
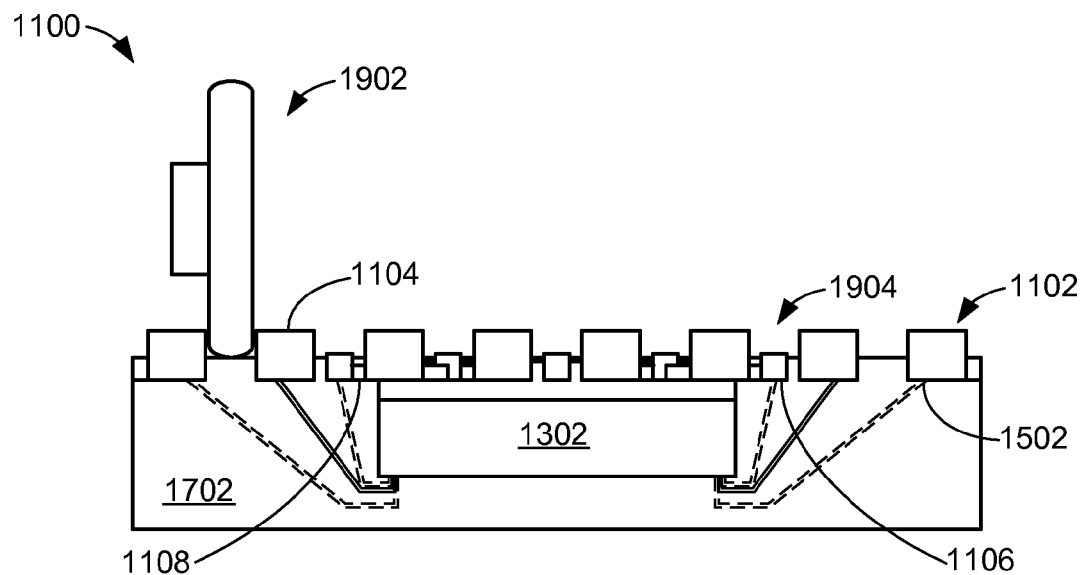
FIG. 19 is a cross-sectional view of the structure of FIG. 18 in an isolation phase.

Referring now to FIG. 19, therein is shown a cross-sectional view of the structure of FIG. 18 in an isolation phase. The integrated circuit package system 1100 preferably includes the die interconnects 1502, the integrated circuit die 1302, the lead interconnects 1108, and the lead grid 1102 including the lead blocks 1104, the interposers 1106.

An isolation apparatus 1902 such as a saw, drill, or etch apparatus can remove material of the lead grid 1102 between the lead blocks 1104 isolating each of the lead blocks 1104 or each of the interposers 1106. The lead blocks 1104 or the interposers 1106 can preferably be singulated and thereby electrically isolated from the lead grid 1102 by a lead cavity 1904. The lead blocks 1104 or the interposers 1106 can optionally be electrically connected by lead interconnects 1108 or the die interconnects 1502.

The interposers 1106 can be exposed near a bottom surface of the integrated circuit package system 1100 in the lead cavity 1904. A bottom surface of the encapsulant 1702 can be adjacent and partially coplanar to an exposed surface of the interposers 1106. The encapsulant 1702 can also be formed in space adjacent vertical surfaces of the interposers 1106 and the lead blocks 1104.

Figure 20:
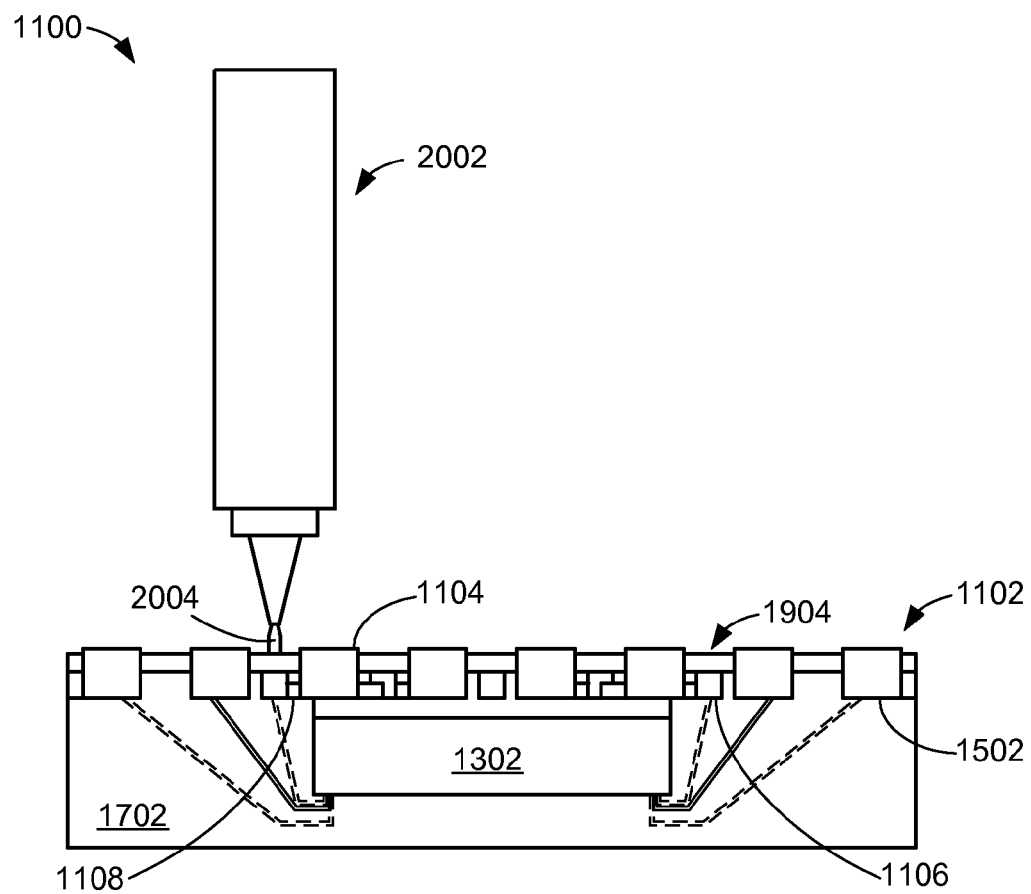
FIG. 20 is a cross-sectional view of the structure of FIG. 19 in a gap fill phase.

Referring now to FIG. 20, therein is shown a cross-sectional view of the structure of FIG. 19 in a gap fill phase. The integrated circuit package system 1100 preferably includes the die interconnects 1502, the integrated circuit die 1302, the lead interconnects 1108, and the lead grid 1102 including the lead blocks 1104 and the interposers 1106. The lead blocks 1104 and the interposers 1106 can be singulated and thereby electrically isolated by the lead cavity 1904.

A fill apparatus 2002 such as dispenser or applicator can apply a fill material 2004 such as a non-conductive material over the lead cavity 1904. The fill material 2004 can preferably be applied adjacent the lead blocks 1104 of the lead grid 1102 and over the encapsulant 1702 to provide protection, structural integrity, or a mounting surface for a bottom surface of the integrated circuit package system 1100.

Figure 21:
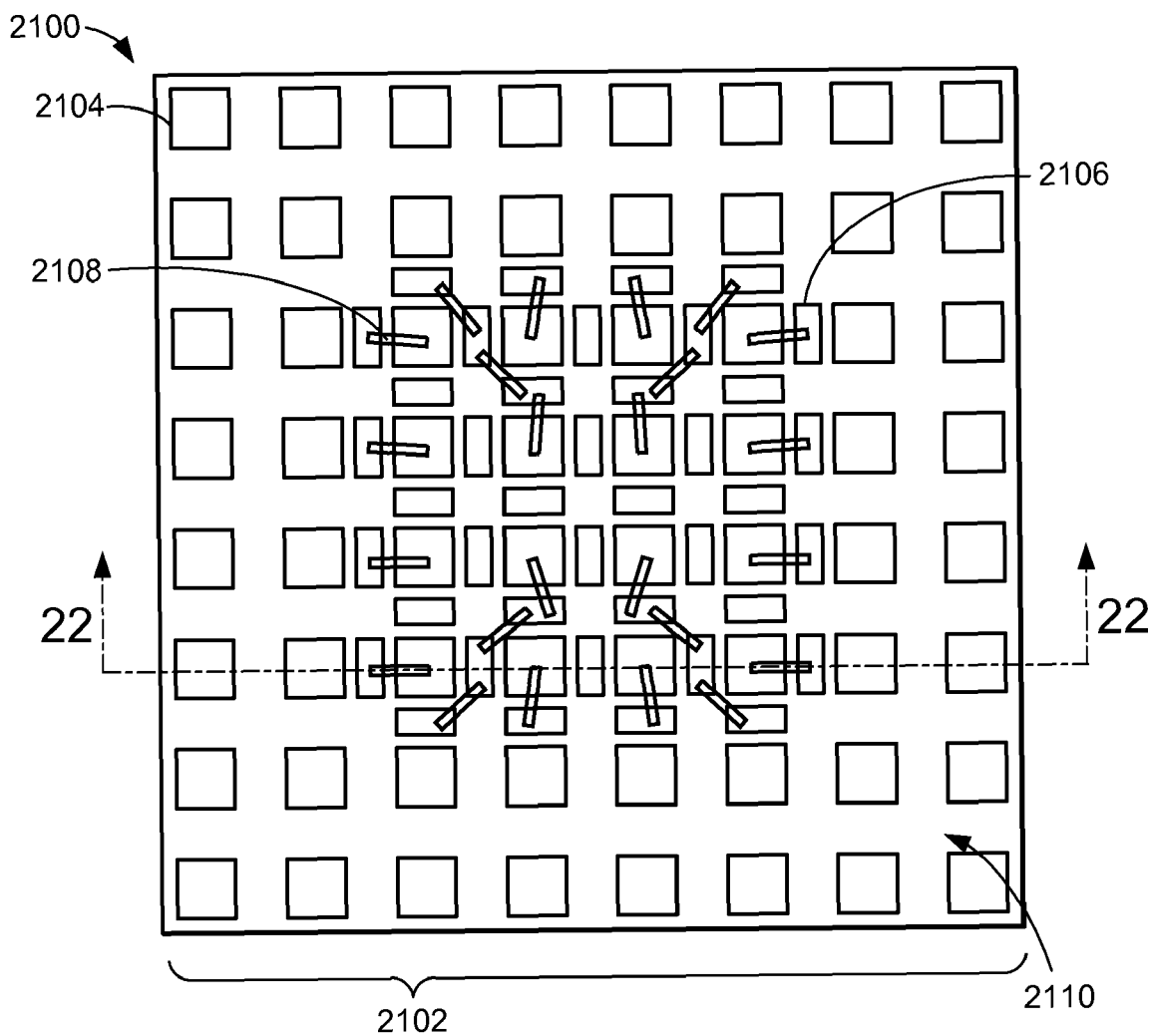
FIG. 21 is a top view of an integrated circuit package system in a lead connection phase of a sixth embodiment of the present invention.

Referring now to FIG. 21, therein is shown a top view of an integrated circuit package system 2100 in a lead connection phase of a sixth embodiment of the present invention. Similar to the integrated circuit package system 300 of FIG. 3, the integrated circuit package system 2100 preferably includes a lead grid 2102 having lead blocks 2104 and interposers 2106. Lead interconnects 2108 such as wire bond interconnects can electrically connect the lead blocks 2104 to the interposers 2106 or other of the lead blocks 2104.

The lead grid 2102 can preferably be formed with leadframe technology such as etching or stamping. Formed as a leadframe, the lead grid 2102 can provide compatibility with singulation technology such as sawing or punching. The lead blocks 2104 and the interposers 2106 formed in a shape of substantially orthogonal rows and columns facilitate electrical isolation with linear isolation processes such as sawing.

For example, the lead blocks 2104 can have a thickness substantially the same as a leadframe or leadframe lead. The lead blocks 2104 can be in a shape such as a rectangular block, an elliptical block, or other shape substantially the same or different from the interposers 2106. The thickness of the lead blocks 2104 enable direct contact surfaces for die interconnect and system connection.

The lead grid 2102 can include the lead blocks 2104 and the interposers 2106 preferably formed by a material removal process such as a half-etch applied to a top surface of the lead grid 2102. Removal of material from the lead grid 2102 provides a top surface of the lead blocks 2104 and a top surface of the interposers 2106 substantially exposed and in a separate plane from a leadframe top recess 2110 of the top surface of the lead grid 2102.

The lead interconnects 2108 provide connectivity to the lead blocks 2104 and the interposers 2106 particularly near a predetermined region. The predetermined region can be based on the lead interconnects 2108 or the interposers 2106 covered during further processing whereby the lead interconnects 2108 can provide connectivity to the lead interconnects 2108 or the interposers 2106 substantially exposed during further processing.

The lead blocks 2104 and the interposers 2106 provide connectivity for the integrated circuit package system 2100 and to a next level system such as a printed circuit board or another package. The lead interconnects 2108 can provide connectivity between the lead blocks 2104 and the interposers 2106 particularly in regions covered by further processing thereby providing improved routing.

Figure 22:
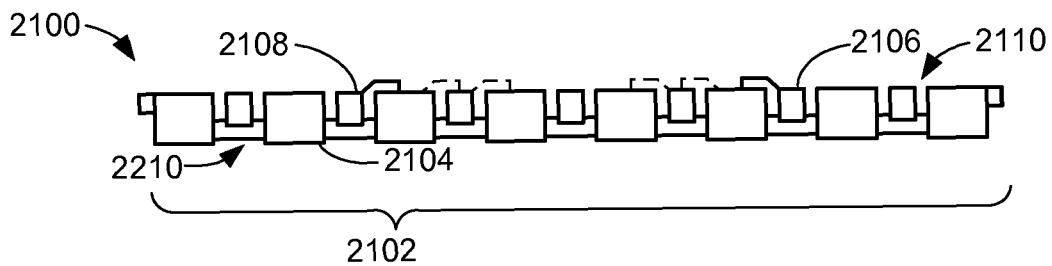
FIG. 22 is a cross-sectional view taken along line 22-22 of FIG. 21.

Referring now to FIG. 22, therein is shown a cross-sectional view taken along line 22-22 of FIG. 21. The integrated circuit package system 2100 preferably includes the lead blocks 2104 and the interposers 2106 of the lead grid 2102. The lead blocks 2104, the interposers 2106, or the lead grid 2102 can be formed as a leadframe and each can be formed of the same or different materials.

A leadframe bottom recess 2210 similar to the leadframe top recess 2110 can preferably be formed by a material removal process such as a half-etch applied to a bottom surface of the lead grid 2102. The leadframe bottom recess 2210 can be formed in the lead grid 2102 adjacent the lead blocks 2104 providing a bottom surface of the lead blocks 2104 substantially exposed and in a separate plane from the leadframe bottom recess 2210.

Figure 23:
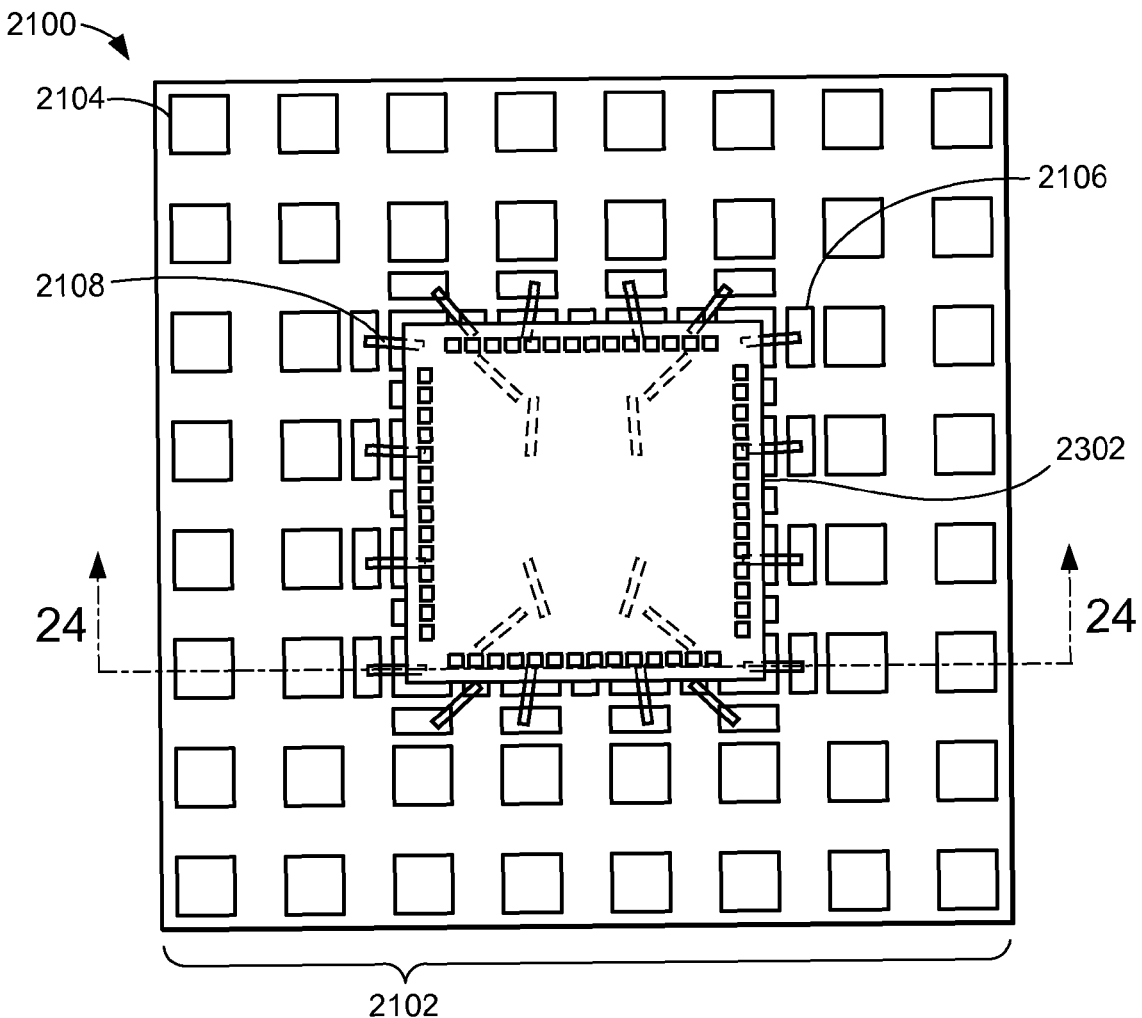
FIG. 23 is a top view of the structure of FIG. 22 in a die attachment phase.

Referring now to FIG. 23, therein is shown a top view of the structure of FIG. 22 in a die attachment phase. The integrated circuit package system 2100 preferably includes the lead blocks 2104 and the interposers 2106 of the lead grid 2102 as well as the lead interconnects 2108. An integrated circuit die 2302 can be mounted over a portion of the lead grid 2102.

The lead blocks 2104 and the interposers 2106 provide connectivity for the integrated circuit die 2302 to the lead grid 2102 or the next level system. The lead interconnects 2108 can provide connectivity between the lead blocks 2104 and the interposers 2106 particularly in regions covered by the integrated circuit die 2302 thereby improving routing of the integrated circuit package system 2100.

Figure 24:
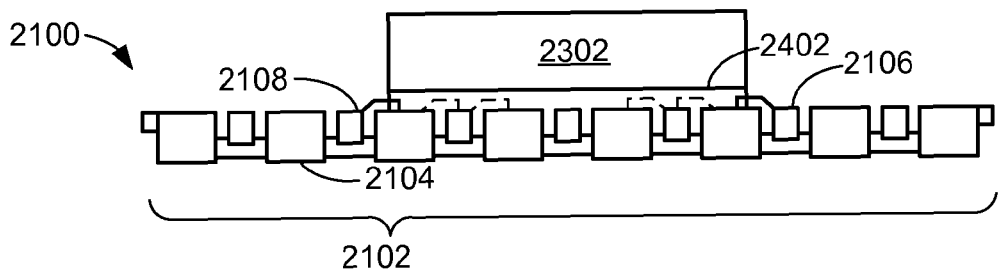
FIG. 24 is a cross-sectional view taken along line 24-24 of FIG. 23.

Referring now to FIG. 24, therein is shown a cross-sectional view taken along line 24-24 of FIG. 23. The integrated circuit package system 2100 preferably includes the lead blocks 2104 and the interposers 2106 of the lead grid 2102 as well as the lead interconnects 2108. The lead interconnects 2108 can provide connectivity between the lead blocks 2104 and the interposers 2106 particularly in a region covered by the integrated circuit die 2302.

The integrated circuit die 2302 can be mounted over a portion of the lead grid 2102 with a die attach layer 2402 such as an adhesive or non-conductive material. The die attach layer 2402 can provide adhesion or isolation of the integrated circuit die 2302 and the lead grid 2102. The lead interconnects 2108 can provide connectivity to the lead blocks 2104 and the interposers 2106 covered by the integrated circuit die 2302 thereby improving routing of the lead grid 2102.

Figure 25:
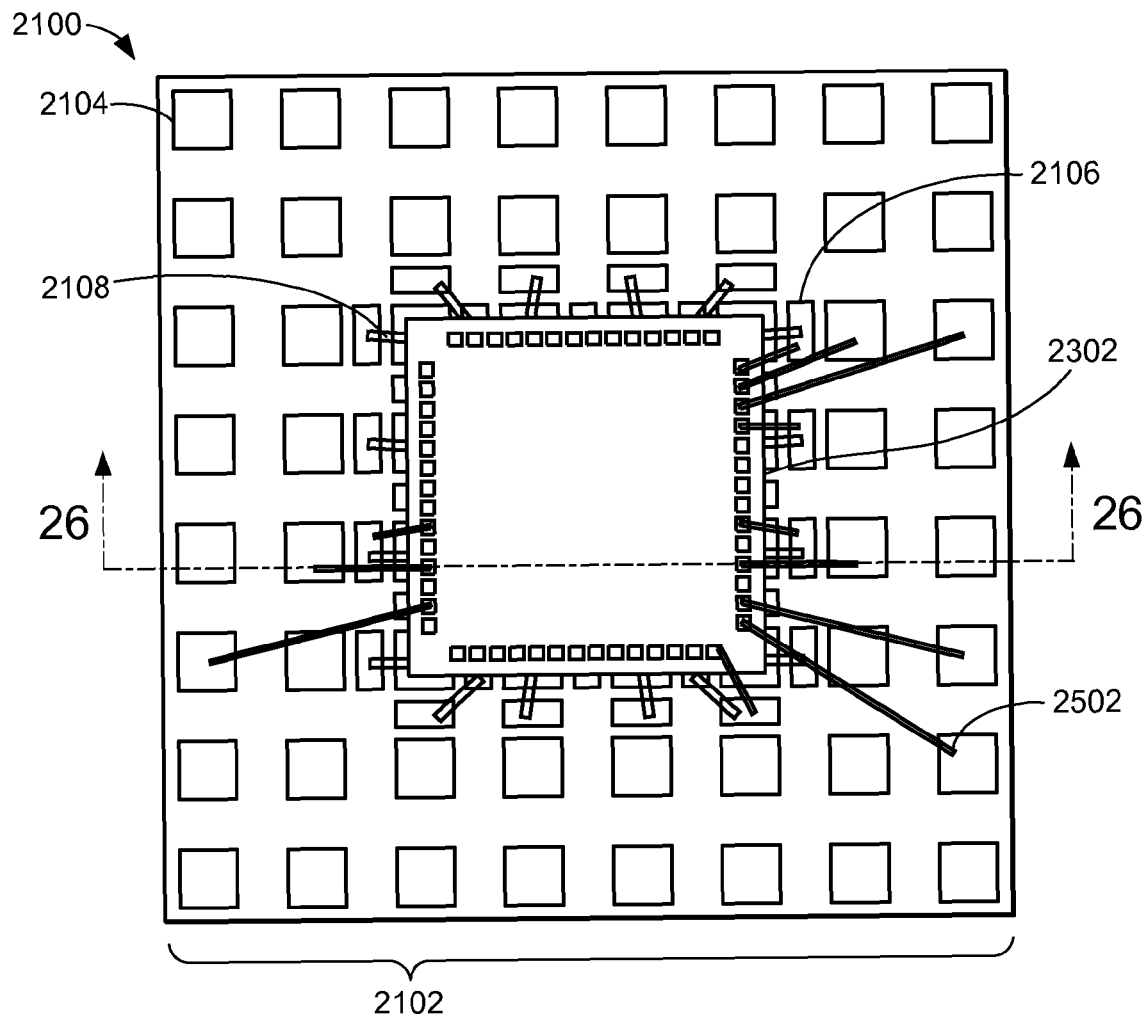
FIG. 25 is a top view of the structure of FIG. 24 in a die connection phase.

Referring now to FIG. 25, therein is shown a top view of the structure of FIG. 24 in a die connection phase. The integrated circuit package system 2100 preferably includes the integrated circuit die 2302, the lead interconnects 2108, and the lead grid 2102 including the lead blocks 2104 and the interposers 2106. Die interconnects 2502 such as a wire bond or other electrical interconnect can be attached to the integrated circuit die 2302, the lead blocks 2104, or the interposers 2106.

The integrated circuit die 2302 can be electrically connected to the lead blocks 2104 or the interposers 2106 of the lead grid 2102 with the die interconnects 2502. The die interconnects 2502 can provide connectivity for logic signals or electrical levels to the integrated circuit die 2302, the lead blocks 2104, or the interposers 2106 thereby providing connectivity to the integrated circuit package system 2100 or the next level system.

Figure 26:
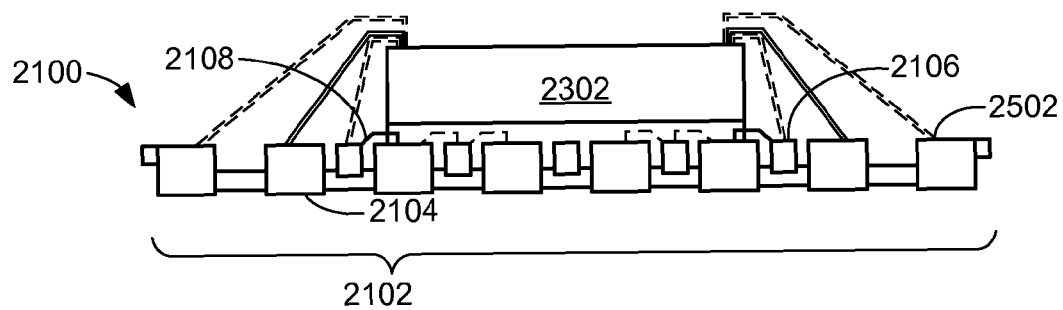
FIG. 26 is a cross-sectional view taken along line 26-26 of FIG. 25.

Referring now to FIG. 26, therein is shown a cross-sectional view taken along line 26-26 of FIG. 25. The integrated circuit package system 2100 preferably includes the integrated circuit die 2302, the lead interconnects 2108, and the lead grid 2102 including the lead blocks 2104 and the interposers 2106. The die interconnects 2502 can be attached to the integrated circuit die 2302, the lead blocks 2104, or the interposers 2106.

The die interconnects 2502 can provide connectivity to the lead blocks 2104 and the interposers 2106. The die interconnects 2502 with the lead interconnects 2108 can also provide connectivity to the lead blocks 2104 and the interposers 2106 covered by the integrated circuit die 2302. The lead blocks 2104 can provide connectivity to the die interconnects 2502 thereby providing connectivity to the next level system.

Figure 27:
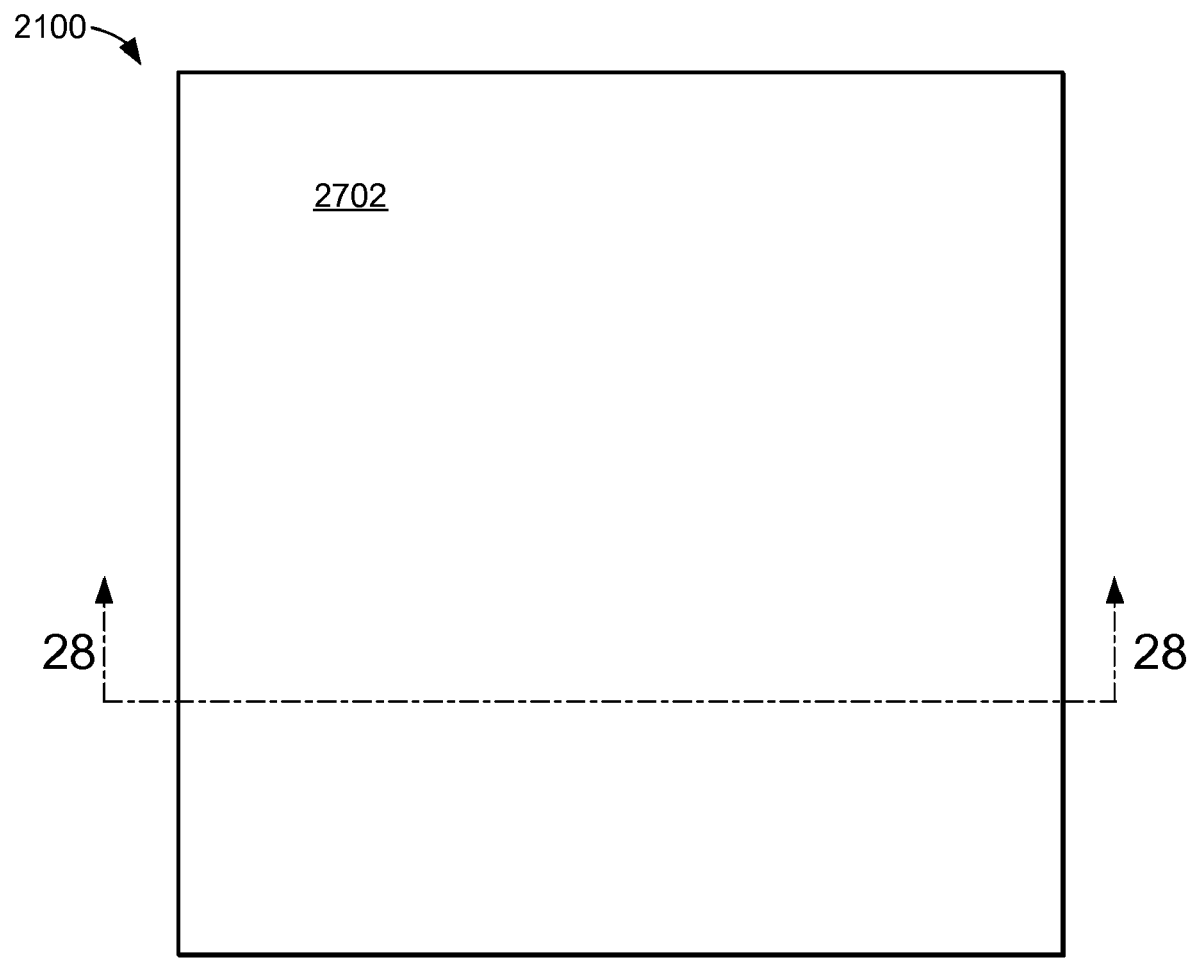
FIG. 27 is a top view of the structure of FIG. 26 in an encapsulation phase.

Referring now to FIG. 27, therein is shown a top view of the structure of FIG. 26 in an encapsulation phase. The integrated circuit package system 2100 preferably includes the die interconnects 2502 of FIG. 25, the integrated circuit die 2302 of FIG. 23, the lead interconnects 2108 of FIG. 21, and the lead grid 2102 of FIG. 21 including the lead blocks 2104 of FIG. 21, the interposers 2106 of FIG. 21.

An encapsulant 2702 such as an epoxy or mold compound can protect the die interconnects 2502, the integrated circuit die 2302, and the lead grid 2102. The encapsulant 2702 can preferably be applied over the die interconnects 2502, the integrated circuit die 2302, and a portion of the lead grid 2102 to cover and protect the die interconnects 2502, the integrated circuit die 2302, the lead blocks 2104, the interposers 2106, and connections thereof.

Figure 28:
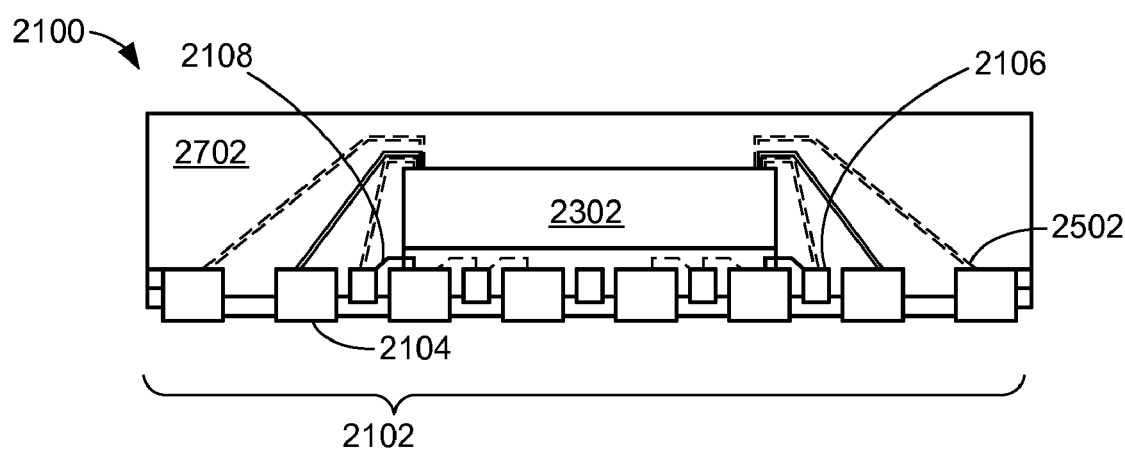
FIG. 28 is a cross-sectional view taken along line 28-28 of FIG. 27.

Referring now to FIG. 28, therein is shown a cross-sectional view taken along line 28-28 of FIG. 27. The integrated circuit package system 2100 preferably includes the die interconnects 2502, the integrated circuit die 2302, the lead interconnects 2108, and the lead grid 2102 including the lead blocks 2104, the interposers 2106.

The encapsulant 2702 can be applied with an encapsulation process such as transfer molding, glob top, or tape lid to cover and protect the die interconnects 2502, the integrated circuit die 2302, the lead interconnects 2108, and a portion of the lead grid 2102. The encapsulant 2702 can optionally be conformal, a lid, or a cover and can optionally provide a hermetic seal, structural integrity, or protective cover.

Figure 29:
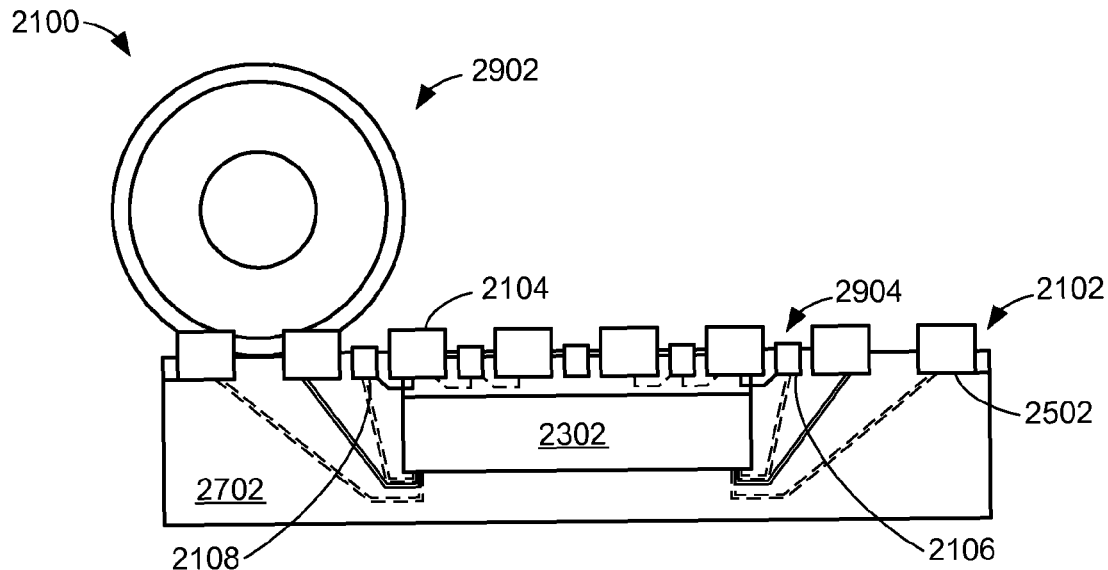
FIG. 29 is a cross-sectional view of the structure of FIG. 28 in an isolation phase.

Referring now to FIG. 29, therein is shown a cross-sectional view of the structure of FIG. 28 in an isolation phase. The integrated circuit package system 2100 preferably includes the die interconnects 2502, the integrated circuit die 2302, the lead interconnects 2108, and the lead grid 2102 including the lead blocks 2104, the interposers 2106.

An isolation apparatus 2902 such as a saw, drill, or etch apparatus can remove material of the lead grid 2102 between the lead blocks 2104 isolating each of the lead blocks 2104 or each of the interposers 2106. The lead blocks 2104 or the interposers 2106 can preferably be singulated and thereby electrically isolated from the lead grid 2102 by a lead cavity 2904. The lead blocks 2104 or the interposers 2106 can optionally be electrically connected by lead interconnects 2108 or the die interconnects 2502.

The interposers 2106 can be exposed near a bottom surface of the integrated circuit package system 2100 in the lead cavity 2904. A bottom surface of the encapsulant 2702 can be adjacent and partially coplanar to an exposed surface of the interposers 2106. The encapsulant 2702 can also be formed in space adjacent vertical surfaces of the interposers 2106 and the lead blocks 2104.

Figure 30:
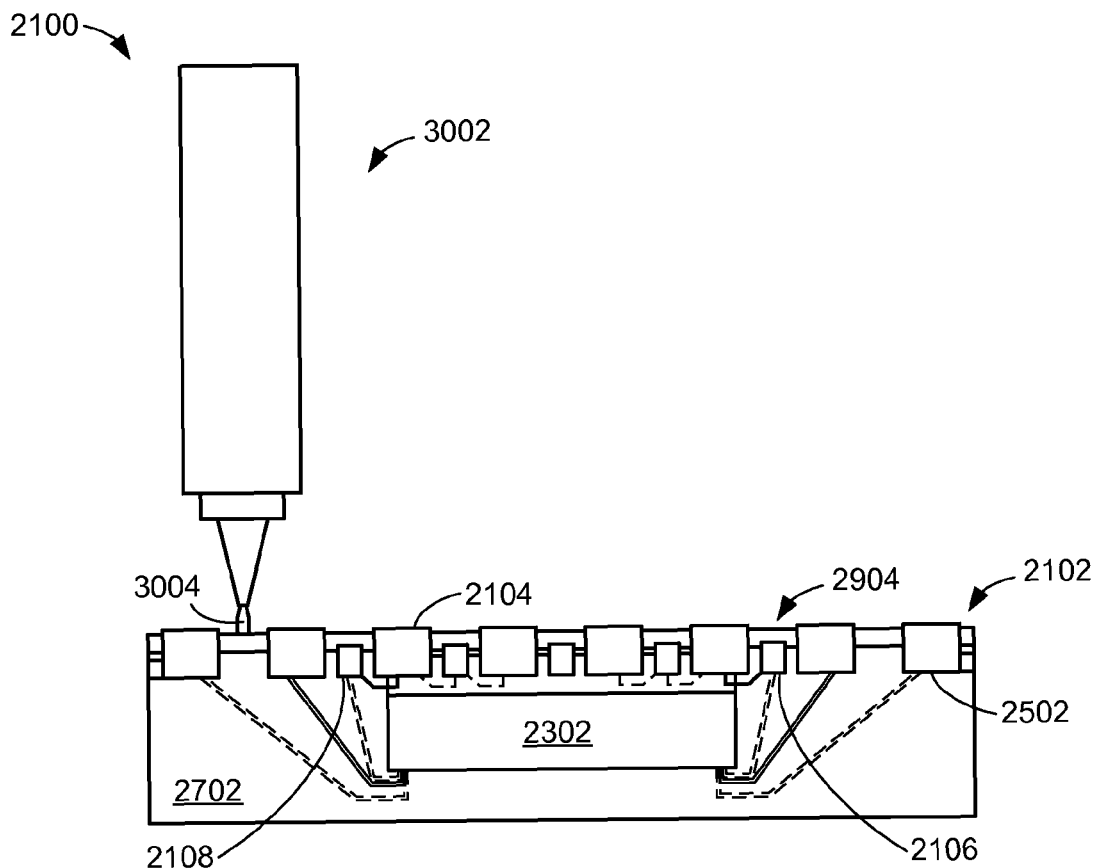
FIG. 30 is a cross-sectional view of the structure of FIG. 29 in a gap fill phase.

Referring now to FIG. 30, therein is shown a cross-sectional view of the structure of FIG. 29 in a gap fill phase. The integrated circuit package system 2100 preferably includes the die interconnects 2502, the integrated circuit die 2302, the lead interconnects 2108, and the lead grid 2102 including the lead blocks 2104 and the interposers 2106. The lead blocks 2104 and the interposers 2106 can be singulated and thereby electrically isolated by the lead cavity 2904.

A fill apparatus 3002 such as dispenser or applicator can apply a fill material 3004 such as a non-conductive material over the lead cavity 2904. The fill material 3004 can preferably be applied adjacent the lead blocks 2104 of the lead grid 2102 and over the encapsulant 2702 to provide protection, structural integrity, or a mounting surface for a bottom surface of the integrated circuit package system 2100.

Figure 31:
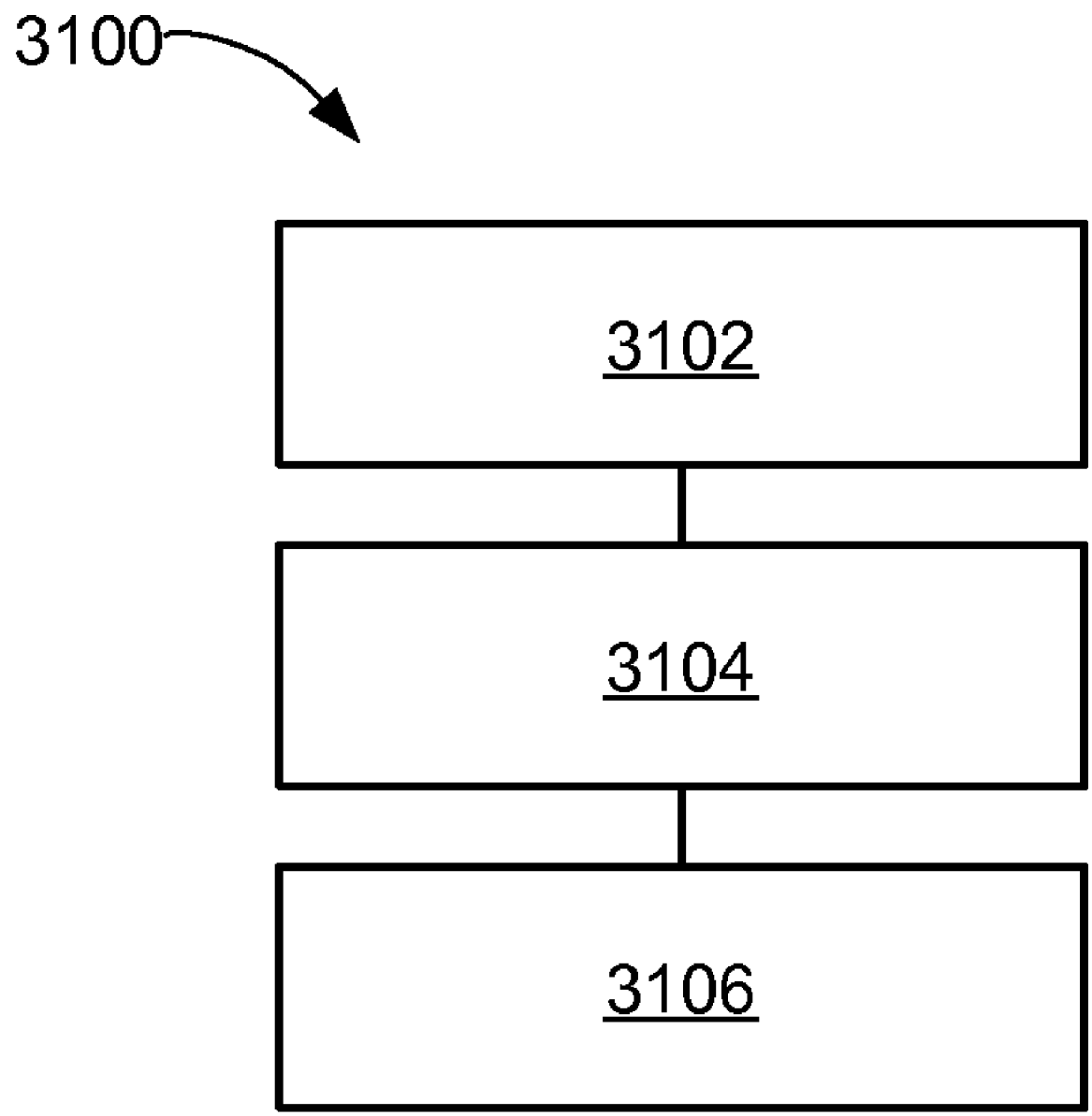
FIG. 31 is a flow chart of an integrated circuit package system for manufacturing the integrated circuit package system in an embodiment of the present invention.

Referring now to FIG. 31, therein is shown a flow chart of an integrated circuit package system 3100 for manufacturing the integrated circuit package system 100 in an embodiment of the present invention. The system 3100 includes providing an integrated circuit die in a block 3102; attaching the integrated circuit die over a lead grid having lead blocks in a block 3104; and connecting a die interconnect to the integrated circuit die and the lead blocks in a block 3106.

In greater detail, a system to provide the method and apparatus of the integrated circuit package system 100, in an embodiment of the present invention, is performed as follows:

1. Providing an integrated circuit die.
2. Attaching the integrated circuit die over a predetermined region of a lead grid having lead blocks in a shape of rows and columns.
3. Connecting a die interconnect to the integrated circuit die and the lead blocks adjacent the predetermined region.
4. Applying an encapsulant over the die interconnect, the integrated circuit die, and the lead blocks.

Thus, it has been discovered that the method and apparatus of the present invention furnish important and heretofore unknown and unavailable solutions, capabilities, and functional aspects. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:
1. An integrated circuit package system comprising:
   providing an integrated circuit die;
   attaching the integrated circuit die over a lead grid having lead blocks and an interposer with the lead blocks extending below the interposer; and
   connecting a die interconnect to the integrated circuit die and the lead blocks; and wherein a gap fill material fills a gap between the lead blocks and under a bottom surface of the interposer.

2. The system as claimed in claim 1 wherein connecting the die interconnect is between the integrated circuit die and the interposer.

3. The system as claimed in claim 1 further comprising attaching a lead interconnect to one of the lead blocks and another of the lead blocks.

4. The system as claimed in claim 1 further comprising attaching a lead interconnect to one of the lead blocks and an interposer.

5. An integrated circuit package system comprising:
providing an integrated circuit die;
attaching the integrated circuit die over a predetermined region of a lead grid having lead blocks and an interposer with the lead blocks extending below the interposer in a shape of rows and columns;
connecting a die interconnect to the integrated circuit die and the lead blocks adjacent the predetermined region;
applying an encapsulant over the die interconnect, the integrated circuit die, and the lead blocks; and
wherein a gap fill material fills a gap between the lead blocks and under a bottom surface of the interposer.

6. The system as claimed in claim 5 wherein providing the lead grid includes forming the lead blocks in a shape of substantially orthogonal rows and columns.

7. The system as claimed in claim 5 wherein providing the lead grid includes forming an interposer between the lead blocks.

8. The system as claimed in claim 5 further comprising attaching a lead interconnect to one of the lead blocks and another of the lead blocks in the predetermined region of the lead grid.

9. The system as claimed in claim 5 further comprising attaching a lead interconnect to one of the lead blocks and an interposer in the predetermined region of the lead grid.

10. An integrated circuit package system comprising:
an integrated circuit die;
a lead grid having lead blocks and an interposer with the integrated circuit die thereover and with the lead blocks extending below the interposer; and
a die interconnect connected to the integrated circuit die and the lead blocks; and
a gap fill material filling a gap between the lead blocks and under a bottom surface of the interposer.

11. The system as claimed in claim 10 wherein the die interconnect is between the integrated circuit die and the interposer.

12. The system as claimed in claim 10 further comprising a lead interconnect attached to one of the lead blocks and another of the lead blocks.

13. The system as claimed in claim 10 further comprising a lead interconnect attached to one of the lead blocks and an interposer.

14. The system as claimed in claim 10 wherein:
the integrated circuit die is over a predetermined region of the lead grid having the lead blocks in a shape of rows and columns;
the die interconnect is connected to the integrated circuit die and the lead blocks adjacent the predetermined region; and
further comprising:
an encapsulant over the die interconnect, the integrated circuit die, and the lead blocks.

15. The system as claimed in claim 14 wherein the lead grid includes the lead blocks in a shape of substantially orthogonal rows and columns.

16. The system as claimed in claim 14 wherein the lead grid includes an interposer between the lead blocks.

17. The system as claimed in claim 14 further comprising a lead interconnect attached to one of the lead blocks and another of the lead blocks in the predetermined region of the lead grid.

18. The system as claimed in claim 14 further comprising a lead interconnect attached to one of the lead blocks and an interposer in the predetermined region of the lead grid.

* * * * *

UNITED STATES PATENT AND TRADEMARK OFFICE
CERTIFICATE OF CORRECTION

| | | |
|---|---|---|
| PATENT NO. | : 7,915,716 B2 | |
| APPLICATION NO. | : 11/862406 | |
| DATED | : March 29, 2011 | |
| INVENTOR(S) | : Pisigan et al. | |

It is certified that error appears in the above-identified patent and that said Letters Patent is hereby corrected as shown below:

Column 15:
    Line 38, claim 10, delete "interposer; and" and insert therefor -- interposer; --

Signed and Sealed this
Seventh Day of June, 2011

David J. Kappos
*Director of the United States Patent and Trademark Office*